United States Patent [19]

Gregerson et al.

[11] Patent Number: 4,966,284

[45] Date of Patent: Oct. 30, 1990

[54] SUBSTRATE PACKAGE

[75] Inventors: Barry Gregerson, Shorewood; Larry Dressen, Waconia, both of Minn.

[73] Assignee: Empak, Inc., Chanhassen, Minn.

[21] Appl. No.: 331,291

[22] Filed: Mar. 31, 1989

Related U.S. Application Data

[63] Continuation-in-part of Ser. No. 198,464, May 24, 1988, which is a continuation-in-part of Ser. No. 70,435, Jul. 7, 1987, Pat. No. 4,793,488.

[51] Int. Cl.⁵ .............................................. B65D 85/57
[52] U.S. Cl. ..................................... 206/444; 206/334; 206/454; 206/508; 206/511; 206/515
[58] Field of Search ............... 206/328, 454, 455, 444, 206/334, 508, 511, 515

[56] References Cited

U.S. PATENT DOCUMENTS

| | | | |
|---|---|---|---|
| 4,520,925 | 6/1985 | Johnson | 206/454 |
| 4,557,382 | 12/1985 | Johnson | 206/454 |
| 4,718,549 | 1/1988 | Rissotti et al. | |
| 4,752,007 | 6/1988 | Rossi et al. | 206/454 |
| 4,793,488 | 12/1988 | Mortensen | 206/454 |
| 4,817,795 | 4/1989 | Kos | 206/454 |

Primary Examiner—Joseph M. Moy
Attorney, Agent, or Firm—Hugh D. Jaeger

[57] ABSTRACT

A sealable contamination proof container package bottom and top for storing and transporting a plurality of substrates or wafers in a robotic wafer carrier. The package bottom includes four sides, a continuous vertical surface for tape sealing surrounding the four sides, a lip positioned on a vertical edge, opposing hook latches on opposing sides, opposing hand grip recesses on the opposing sides and a raised bottom surface for package stacking. The package top includes four sides, a continuous vertical surface for tape sealing surrounding the four sides, a lip positioned on the vertical surface, opposing hook catches on the opposing side, a top surface with raised stacking surfaces, and two rows of wafer support springs positioned on bars on the underside of the top surface. The package top and bottom halves provide that the robotic wafer carrier mates between the package top and package bottom with the wafers or substrates in the carrier. The package top and bottom mate with the upper lip engaged with the lower lip, and the catches of the top engage with the latches of the bottom. The package halves are designed in such a fashion as to prevent wafer or substrate damage upon opening, in that the top package half is moved in a direction coinciding to the plane of the wafers or substrates with respect to positioning of the catches and latches on the package side. Appropriate sides of the package top and bottom are plumb with each other providing for a flush perimeter for ease of taping. The raised top portion of the top package half and the recessed bottom of the bottom package half provides for stacking of like packages. In an alternative embodiment, opposing rows of articulated cantilevered horizontal arms with centering V grooves on each end for engaging a wafer, disk or substrate extend inwardly from the edges of an arced top surface in the package top.

10 Claims, 38 Drawing Sheets

SUBSTRATE PACKAGE

CROSS REFERENCES TO CO-PENDING APPLICATIONS

This is a Continuation-in-part of U.S. Ser. No. 07/198,464, filed May 24, 1988, now pending and assigned to the same assignee which is a continuation-in-part of U.S. Ser. No. 70,435, filed Jul. 7, 1987, now issued as U.S. Pat. No. 4,793,488, on Dec. 27, 1988.

BACKGROUND OF THE INVENTION

1. Field of the Invention

The present invention pertains to a package, and more particularly, pertains to a two-part package for the storing and transporting of semiconductor wafers, disks or substrates in a robotic wafer carrier. The package includes articulated cantilevered horizontal arms with centering V grooves for engaging the member.

2. Description of the Prior Art

Prior art packages have usually lifted from the end. This end lifting caused stress and strain on the end wafers, and sometimes caused breakage as the top slid against the plane of one or more wafers. Further, most prior art packages have opened from the ends, rather than opening from the sides, which resulted in damage from the spring tension on the last tooth and then on the last semiconductor wafer, disk or substrate.

Prior art devices also included wafer hold down members which slid against the periphery of the contained wafer substrate causing an abrasive scraping action which dislodged or caused small particles to break loose near the peripheral edge of the wafer substrate and allowing particle contaminants to invade the otherwise clean interior of the substrate package.

The present invention overcomes the disadvantages of the prior art by providing a package which opens on the side, and by providing wafer support springs which do not scrape or grate upon the wafer substrate, but instead flexingly engage the wafer substrates. The wafer support springs are articulated cantilevered horizontal arms with centering V grooves.

SUMMARY OF THE INVENTION

The general purpose of the present invention is to provide a package for wafers or substrates which opens from the sides and evenly secures and prevents contamination of semiconductor wafers or like articles.

According to one embodiment of the present invention, there is provided a sealable contamination proof semiconductor wafer package, including a bottom and a top. The bottom includes four sides, a continuous vertical surface for tape sealing surrounding the four sides with a lip positioned on a vertical edge, opposing hook latches, opposing hand grip recesses on the opposing sides and a raised bottom surface for stacking of a plurality of packages. The top includes four sides, continuous vertical surface for tape sealing; and surrounding the four sides, a lip positioned on the vertical surface, opposing hook catches, a top surface with a raised stacking surface, and opposing rows of wafer support springs on a two bar articulated member positioned on the underside of the top surface.

According to another embodiment of the present invention, there is provided a sealable contamination proof semiconductor wafer package, including a bottom and a top. The bottom includes four sides, a continuous vertical surface for tape sealing surrounding the four sides with a lip positioned on a vertical edge, opposing hook latches, opposing hand grip recesses on the opposing sides and a raised bottom surface for stacking of a plurality of packages. The top includes four sides, continuous vertical surface for tape sealing; and surrounding the four sides, a lip positioned on the vertical surface, opposing hook catches, an arced top surface with raised stacking surfaces, and opposing rows of horizontally aligned wafer support springs positioned on the underside of the arced top surface. The wafer support springs are articulated cantilevered horizontal arms with centering V grooves.

Significant aspects and features of the present invention include a semiconductor wafer, disk or substrate package which opens from the sides, which thereby equally provides spring pressure on the wafers. The handle is located under the lock assembly. The perimeter of the package is tapable, and further seals the locks. The locks are of such a configuration as to allow a plurality of human fingers and robotic actuators to disengage the lock. Finally, the bottom and the top of the package engage with respect to other like packages for stacking purposes. The package is also aesthetically pleasing by the formation of the surfaces of the package, and the radius geometry on top and bottom are to provide structural support.

Another significant aspect and feature of the present invention is opposing upper rows of horizontally aligned wafer support articulated cantilevered horizontal arms with centering V grooves on the under side of the arced top surface which flexingly engage wafers, disks or substrates. The wafer support springs are articulated cantilevered horizontal arms with centering V grooves. The wafer, disk or substrate is captured in the V groove with minimal contact across the edges of the wafer, disk or substrate.

Other significant aspects and features include articulated cantilevered horizontal arms with centering V grooves which provide minimized reap or stress and optimized tension about the wafer, disk or substrate. The V grooves center about the edges of the wafers, disks or substrates. The horizontal arm with the V groove provides enhanced memory for maintaining the wafer, disk or substrate in the carrier. The V grooves are integrally supported on the articulated cantilevered horizontal arms.

Further significant aspects and features include a package of see through polymer such as a polypropleyene or like polymer material to ensure arm and V groove alignment with a wafer, disk or substrate.

Having thus described the embodiments of the present invention, it is a principal object hereof to provide a package for transporting and storing of semiconductor wafers, disks or substrates.

Objects of the present invention include a high technology state-of-the-art wafer package for storing and transporting semiconductor wafers, disks or substrates which unlocks and opens from either side.

Another object of the present invention is horizontally aligned wafer support articulated cantilevered horizontal arms with centering V grooves for flex engagement of wafers, disks or substrates.

A further object of the present invention is to provide articulated cantilevered horizontal arms with centering V grooves.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
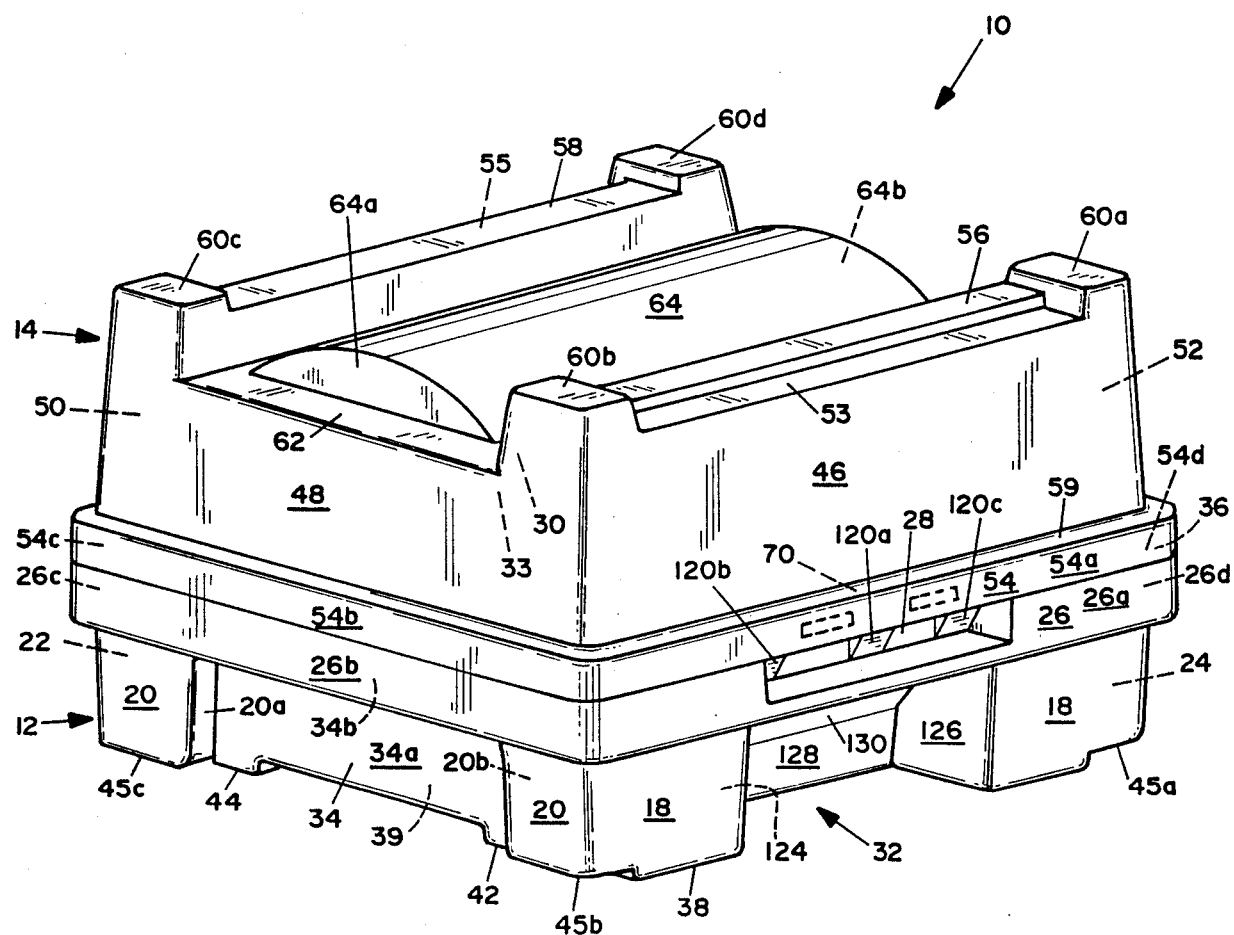
FIG. 1 illustrates a perspective view of a substrate package, the present invention.

FIG. 1 illustrates a perspective view of a package 10, the present invention, for the storage and transportation of substrates or wafers. The package includes a bottom member 12 and a top member 14 engaged to environmentally contain and transport or store a wafer carrier 16, which is illustrated in FIG. 2.

Figure 3:
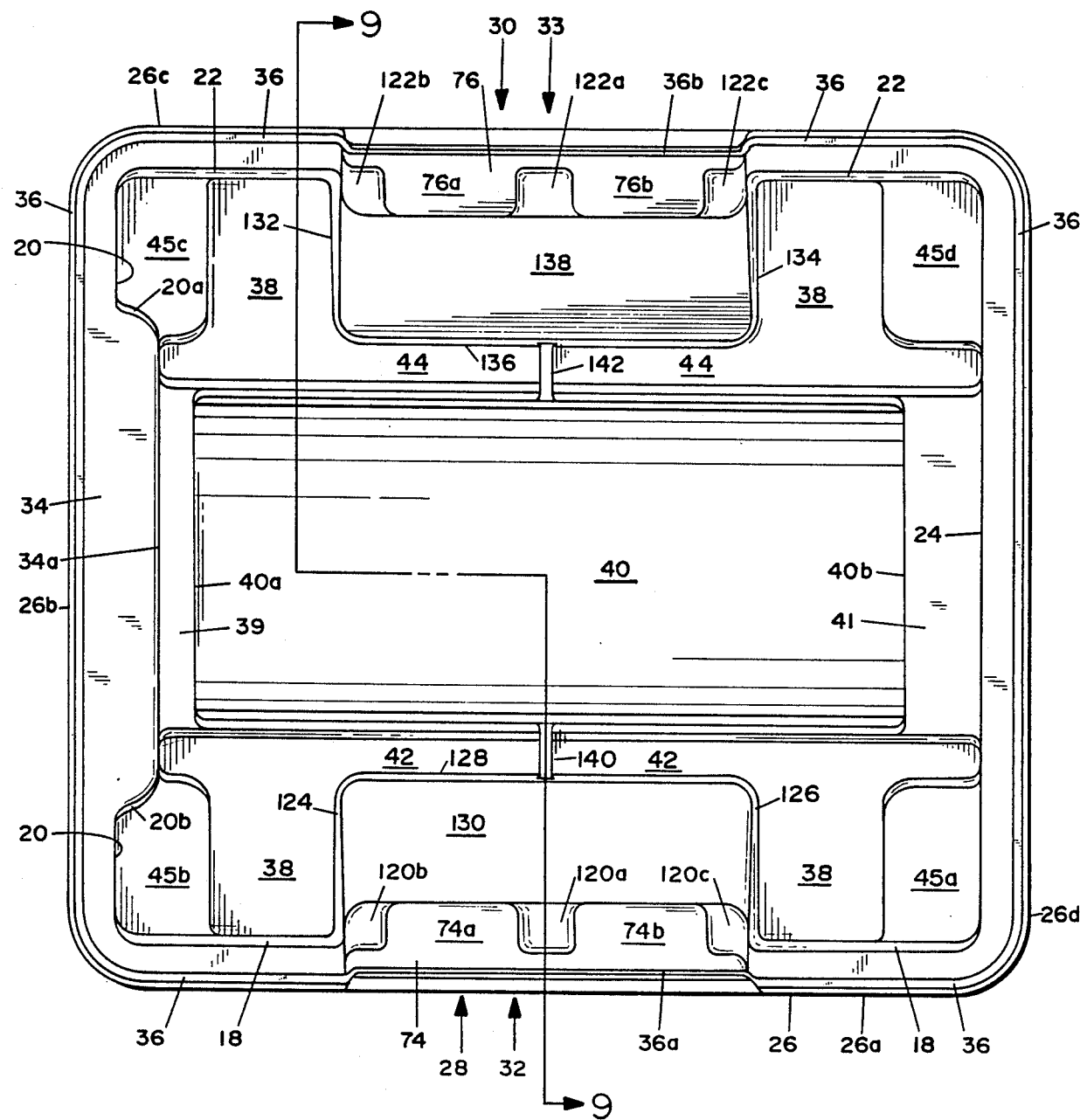
FIG. 3 illustrates a top view of the bottom member.

The bottom member 12 includes sides 18, 20, 22 and 24; a continuous vertical member 26 for taping, including planar surfaces 26a, 26b, 26c and 26d with rounded vertical corners therebetween; and a latch recess 28 located within the planar surface 26a and a corresponding latch recess 30 located within planar surface 26c. A handle recess 32 is set back from the side 18, and a like opposing recess 33 is set back from side 22 as illustrated in FIG. 3. A locating recess index member 34 for indexing a wafer carrier 16 is set back from side 20, and includes wall members 20a, 20b, wall member 34a between wall members 20a and 20b and a horizontal planar member 34b intersecting wall members 20a, 20b and 34a. A continuous lip member 36, as also illustrated in FIG. 3, locates at the upper portion of the continuous vertical member 26 to mate with a corresponding lip in the top member 14 as later described in detail. Upper planar bottom surfaces 39 and 41, with a cylindrical section member 40 including ends 40a and 40b disposed thereupon and extending downwardly from and between the upper planar surfaces 39 and 41, locates between the lower portions of the sides 20 and 24 as illustrated in FIG. 3. Channels 42 and 44 locate parallel to sides 18 and 22 along the lower planar bottom 38 and the long edges of the cylindrical section member 40 for accommodating the wafer carrier 16 as illustrated in FIG. 3. Stacking corner recess members 45a–45d position at the corresponding lower corner portions of the intersections of the sides 18–24 and the planar bottom 38.

Figure 6:
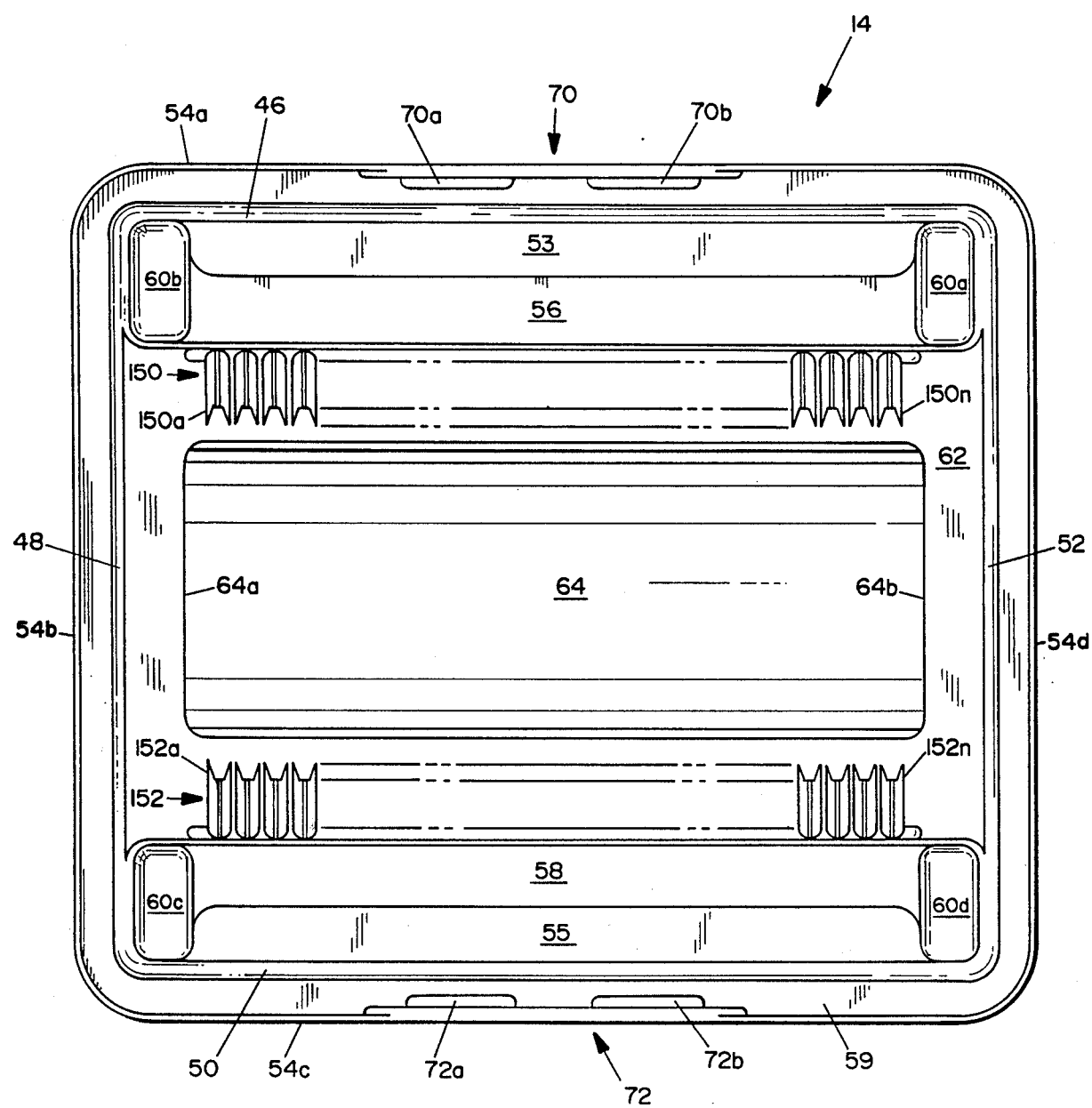
FIG. 6 illustrates a bottom view of the top member.
Figure 9:
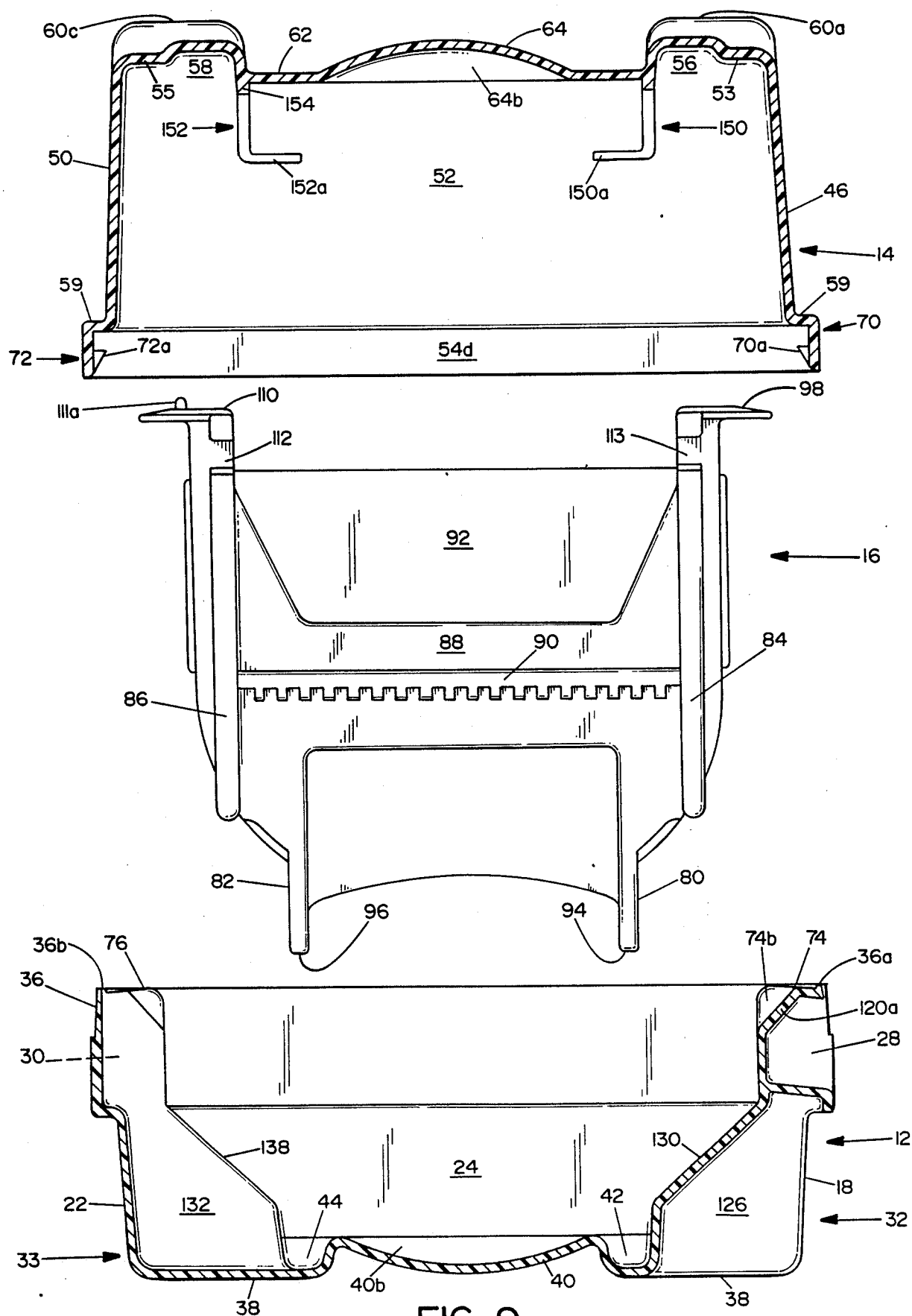
FIG. 9 illustrates an exploded cutaway end view in cross section of the substrate package.

The top member 14 includes sides 46–52; a continuous vertical lip member 54 extending downwardly from the sides 46–52 for taping, including planar surfaces 54a–54d with rounded vertical corners therebetween; channels 56 and 58 parallel to sides 46 and 50 at the upper portion of the sides 46 and 50, respectively, for engagement of the upper regions of the wafer carrier 16; planar members 53 and 55 adjacent to channels 56 and 58 and along the upper portions of the sides 46 and 50; stacking feet 60a–60d extending from and above the respective intersections of sides 46–52 and at respective opposing ends of the channels 56 and 58 as illustrated; a planar surface 62 extending between the channels 56 and 58 and the upper portions of the sides 48 and 52; and a raised cylindrical section 64 including ends 64a and 64b extending upwardly from the planar surface 62. Rows of wafer support springs extend downwardly from the underside of the planar surface to gently secure wafer substrates in the wafer carrier 16, as later described in detail in the figures, particularly in FIGS. 10–12. The continuous vertical lip member 54 fits over the continuous lip member 36 of the bottom member 12 to seal the substrate package 10. The top member 14 includes catch members 70 and 72 as illustrated in FIGS. 6 and 9, and the bottom member 12 includes latch members 74 and 76 each adjacent respectively to the handle recesses 32 and 33 for secure engagement of the top member 14 to the bottom member 12 containing the wafer carrier 16.

Figure 2:
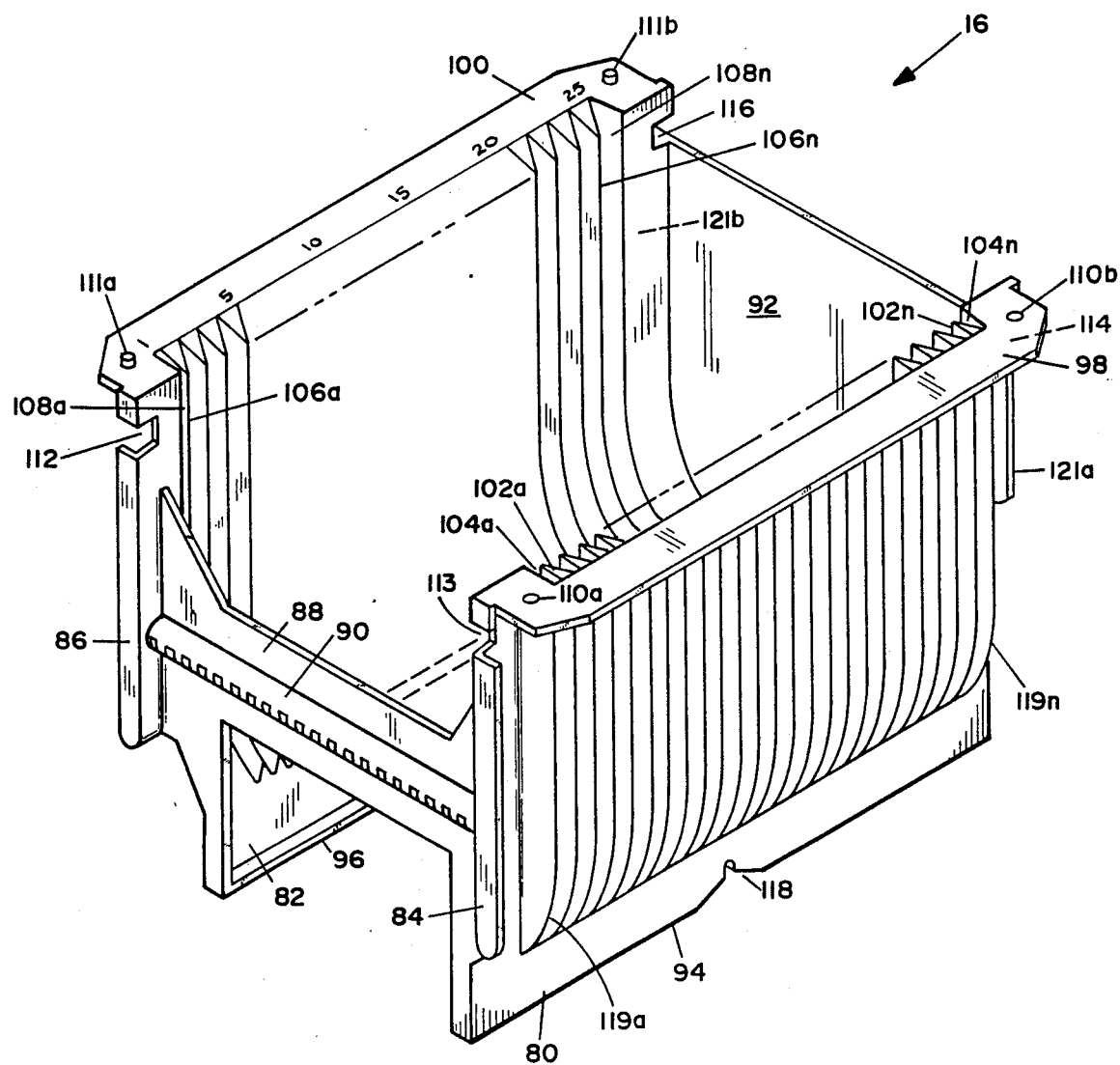
FIG. 2 illustrates a perspective view of a wafer carrier.
Figure 13:
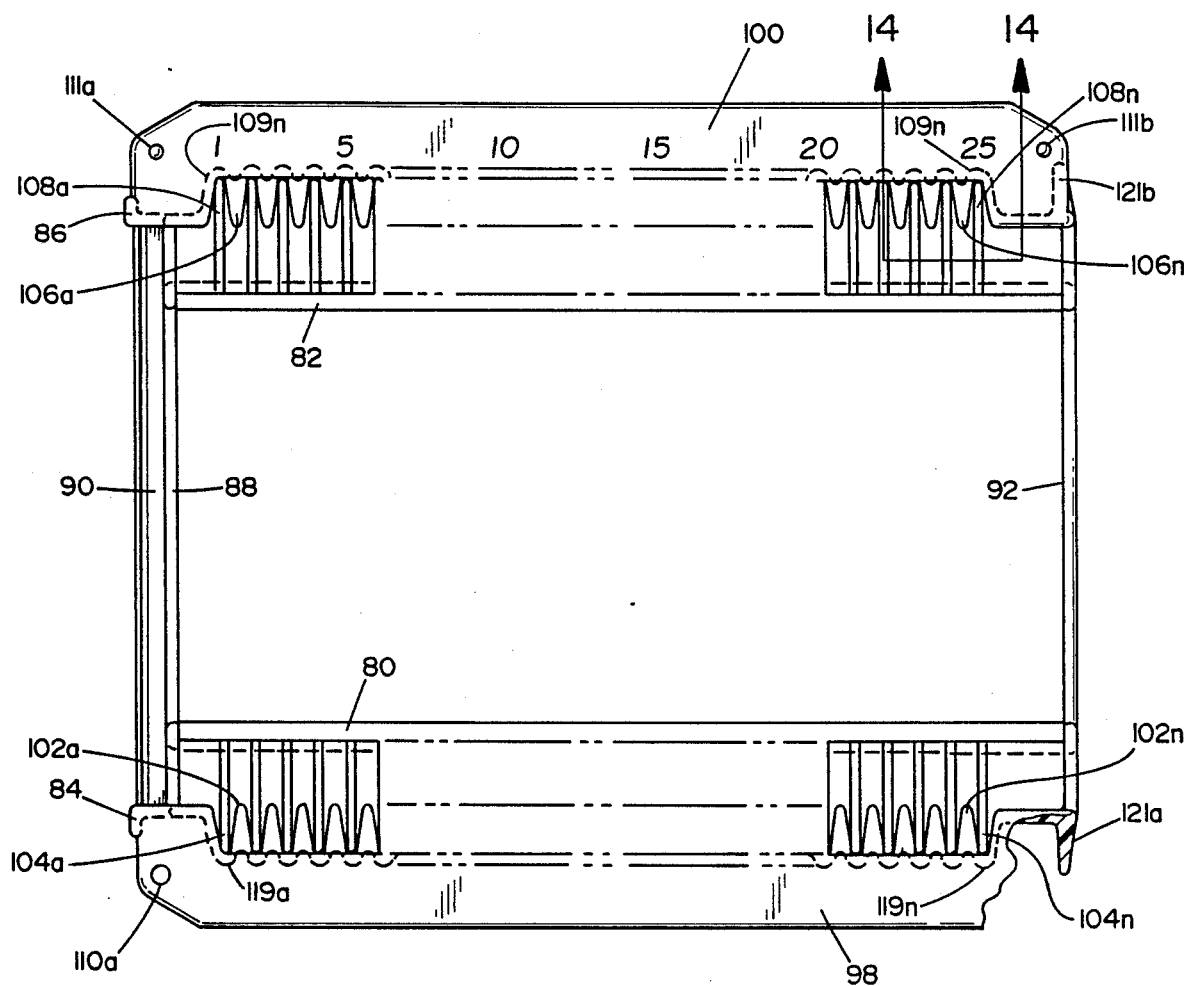
FIG. 13 illustrates a top view of a wafer carrier.
Figure 14:
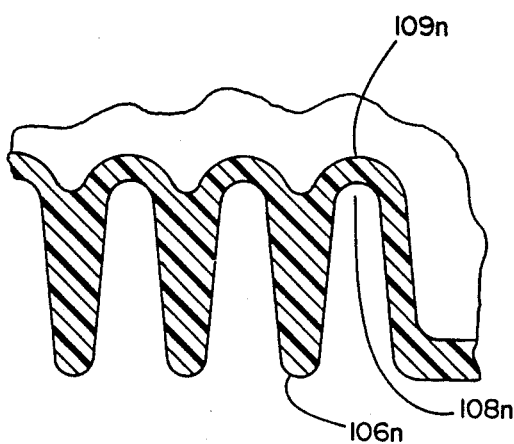
FIG. 14 illustrates a sectional profile view of the divider ribs and wafer pockets.

FIG. 2 illustrates a perspective view of the wafer carrier 16 including opposing sides 80 and 82; a support bar 84 extending vertically and outwardly along an end of side 80; a support bar 86 extending vertically and outwardly along an end of side 82; a configured "H" shaped member 88 and segmented rod half 90 between the support bars 84 and 86 and set back from the support bars 84 and 86; a vertically oriented planar member 92 between the rear portions and flush to the rear portions of sides 80 and 82; bottom edges 94 and 96 along the bottom portion of sides 80 and 82, respectively; a planar top edge 98 along the upper edge of side 80 and between the upper portion support bar 84 and the upper and outer portion of the planar member 92; and a like planar top edge 100 extending along the upper edge of side 82 between the upper portion of support bar 86 and the upper and outer portion of the planar member 92. Ribs 102a-102n and alternating wafer pockets 104a-104n extend vertically along the distance between the planar top edge 98 and the lower portion of side 80 near which point the ribs 102a-102n and the alternating wafer pockets 104a-104n assume a curved cross section to intersect with the lower portion of side 80. In a similar fashion, ribs 106a-106n and alternating wafer pockets 108a-108n extend vertically for the majority of the distance between the planar top edge 100 and the lower portion of side 82 near which point the ribs 102a-102n and the alternating wafer pockets 104a-104n assume a curved cross section to intersect with the lower portion of side 82. Rounded wafer pocket backs 109a-109n and 119a-119n provide for dimensional stability and extend similarly to assume a curved cross section to intersect with the lower portion of side 82, as also illustrated in FIGS. 13 and 14 The planar top edges 98 and 100 include vertically oriented positioning holes and slots 110a-110b and 111a-111b, respectively, near their outer extremities. The wafer carrier 16 also includes robotic handler slots 112 and 113 positioned in the support bars 84 and 86, respectively, and robotic handler slots 114 and 116 positioned at the rear of the wafer carrier 16 adjacent to the top edge of the planar member 92 and the upper portions of sides 80 and 82. Robotic tab members 121a and 121b position on the upper portion of the sides 80 and 82.

FIG. 3 illustrates a top view of the bottom member 12 where all numerals correspond to those elements previously described. The latch recess 28 includes a latch member 74 with an angulated central support member 120a and angulated support members 120b and 120c extending from the mid-portion of the latch member 74 angularly to the lower inner most area of the latch recess 28 as also illustrated in FIG. 1. The latch member 74 is divided into latch surfaces 74a and 74b by the angulated support member 120a. Corresponding angulated latch support members 122a-122c extend in a similar fashion from beneath the latch member 76 into the latch recess 30 located above the handle recess 33. The latch member 76 is divided into latch surfaces 76a and 76b by the angulated support member 122a. The handle recess 32 is illustrated including vertically aligned opposing walls 124 and 126, vertical wall 128 between walls 124 and 126, and an oblique wall 130 slanting toward the center of the bottom member 12 and intersecting walls 124-128. Handle recess 33 includes similarly oriented and aligned opposing walls 132 and 134, wall 136 between walls 132 and 134, and oblique wall 138 interesting walls 132-136. Locator ribs 140 and 142 extend respectively between walls 128 and 136 and the inner side members of channels 42 and 44 and aid in structural support.

Figure 4:
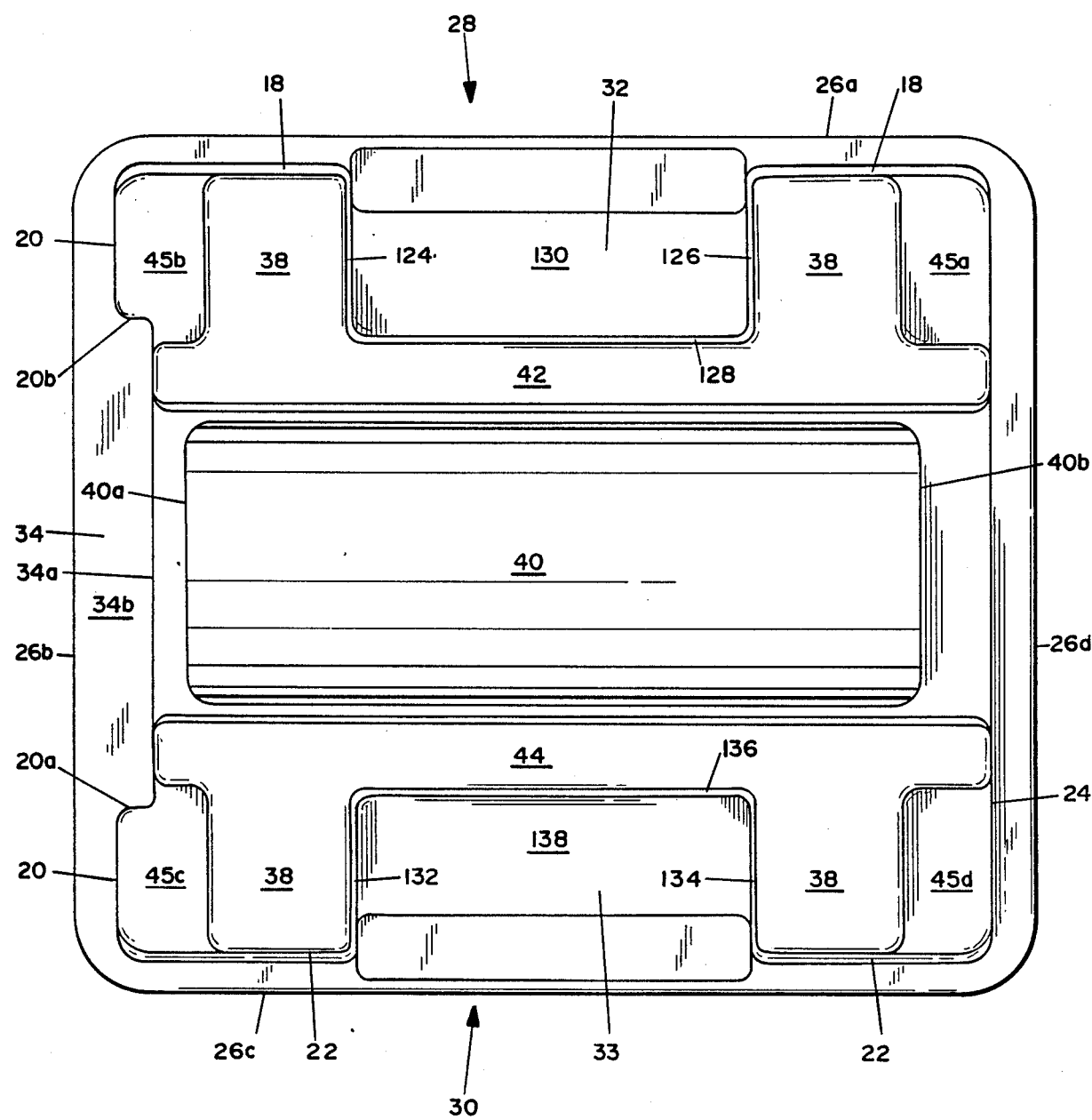
FIG. 4 illustrates a bottom view of the bottom member.

FIG. 4 illustrates a bottom view of the bottom member 12 where all numerals correspond to those elements previously described.

Figure 5:
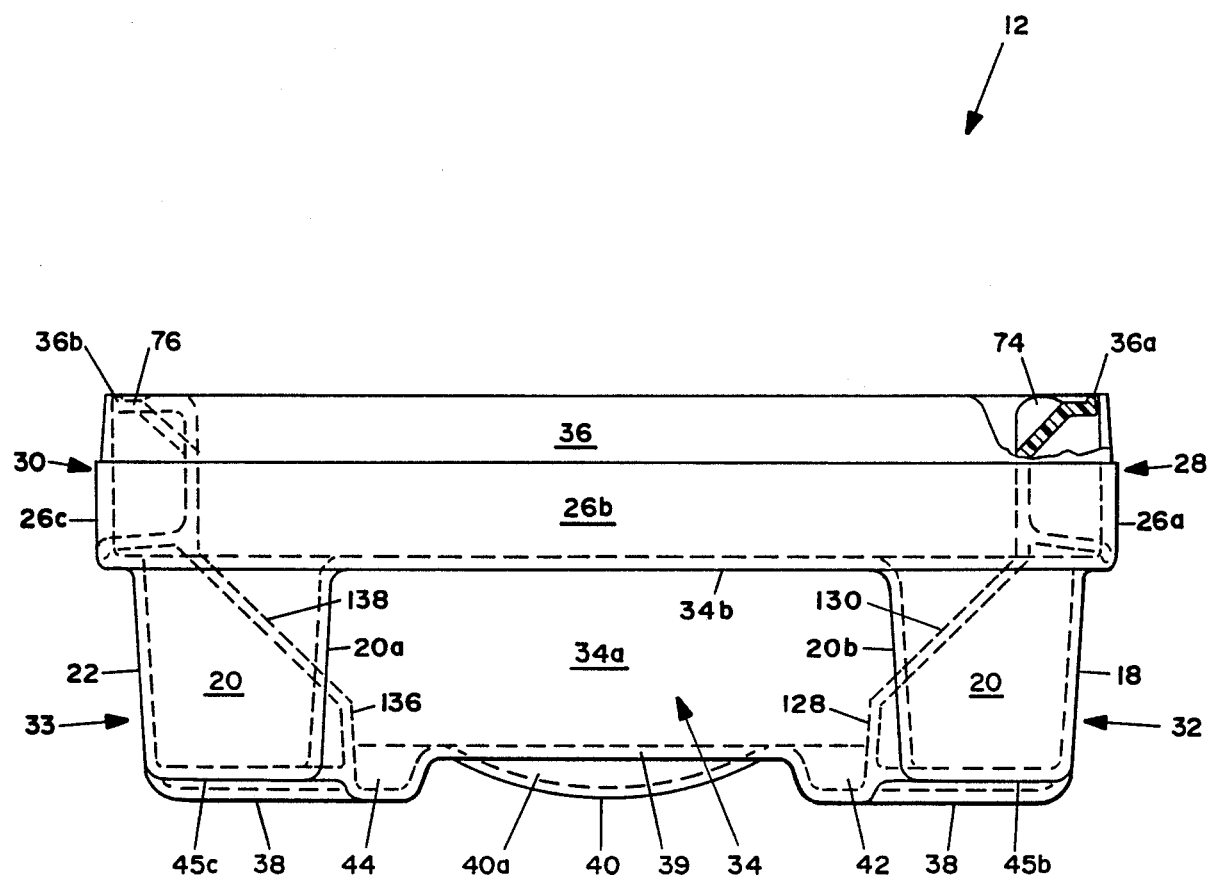
FIG. 5 illustrates an end view of the bottom member.
Figure 17:
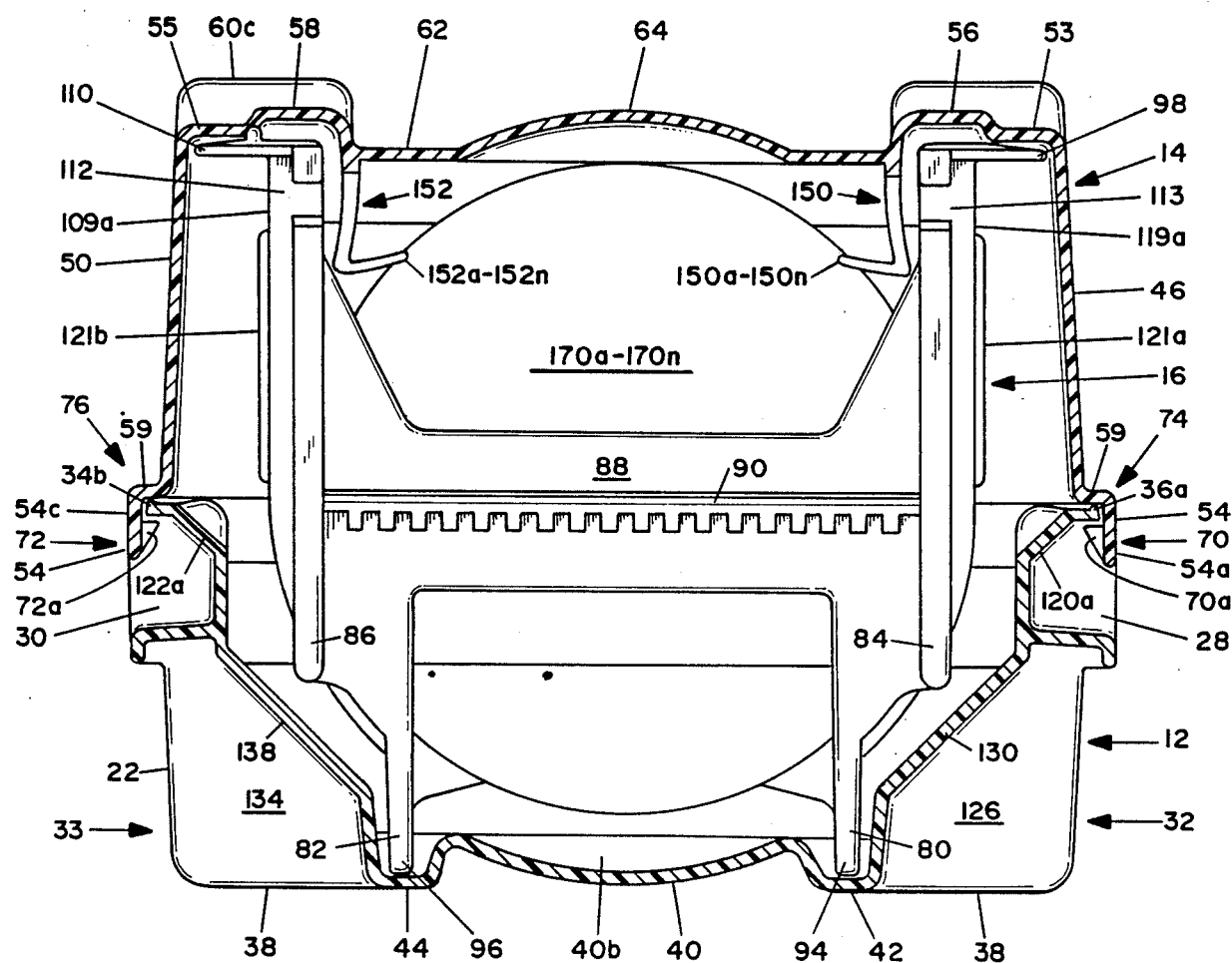
FIG. 17 illustrates a cross-sectional view of the assembled substrate package.

FIG. 5 illustrates an end view of the bottom member 12 where all numerals correspond to those elements previously described. Illustrated in particular is the locating recess index member 34 in side 20. The profile of the continuous lip member 36 is illustrated as 36a and 36b, where the continuous lip member 36 passes through the areas adjacent to the latch members 74 and 76, respectively. Lips 36a and 36b seal against the horizontal undersides of the continuous planar rim 59 on the package top as illustrated in FIG. 17.

FIG. 6 illustrates a bottom view of the top member 14 where all numerals correspond to those elements previously described. Rows of flexible wafer support springs 150 and 152 extend downwardly from the planar surface 62 to gently secure wafer substrates carries in the wafer carrier 16. The flexible wafer support spring rows 150 and 152 include a plurality of wafer support springs 150a-150n and 152a-152n, respectively. Catch members 70 and 72 position on the planar surfaces 54a and 54c, respectively. Catch member 70 includes ramped catches 70a and 70b, and catch member 72 includes ramped catches 72a and 72b. The catch members 70 and 72 of the top member 14 engage the latch members 74 and 76 of the bottom member 12 as illustrated in FIG. 17.

Figure 7:
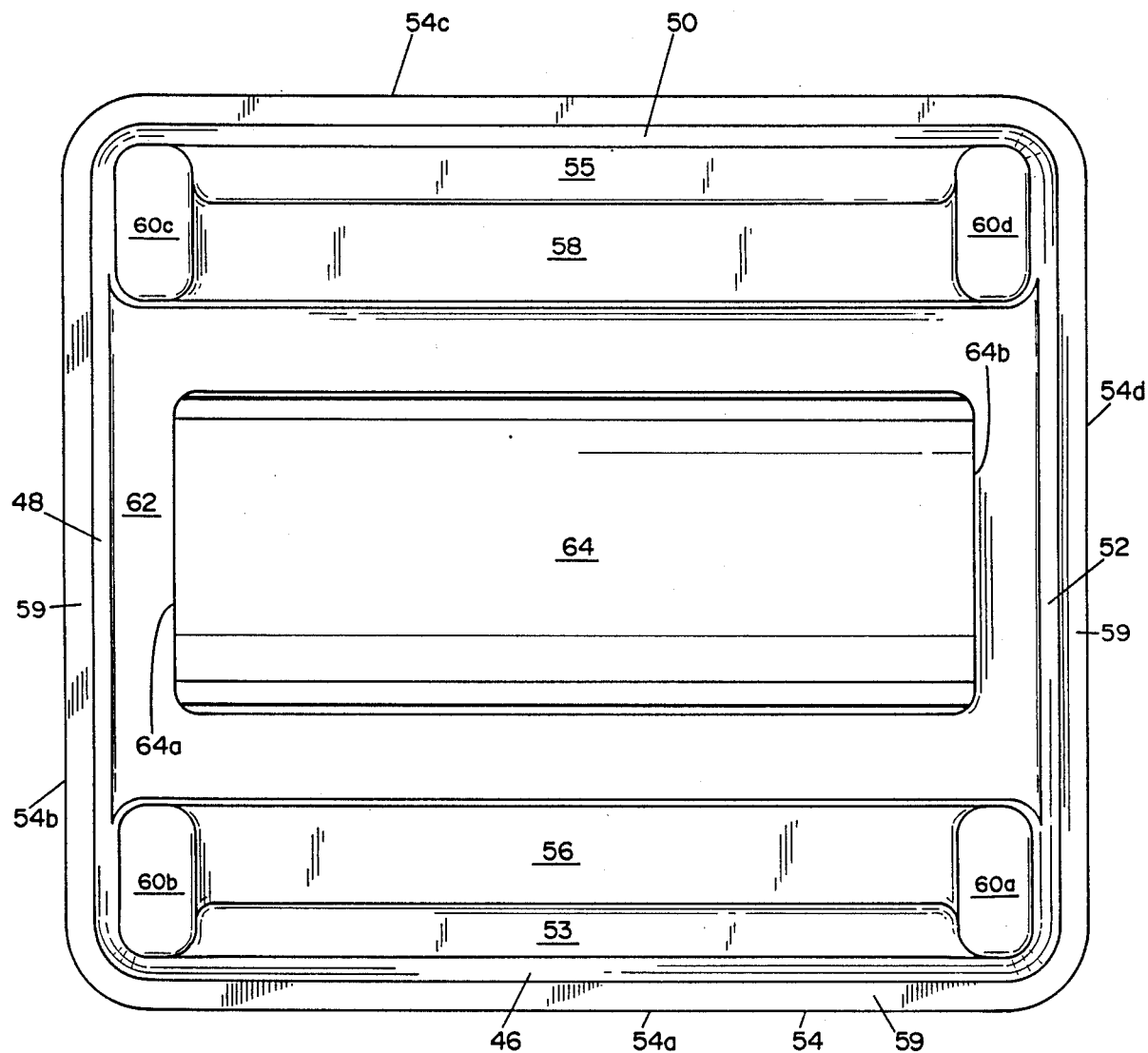
FIG. 7 illustrates a top view of the top member.

FIG. 7 illustrates a top view of the top member 14 where all numerals correspond to those elements previously described.

Figure 8:
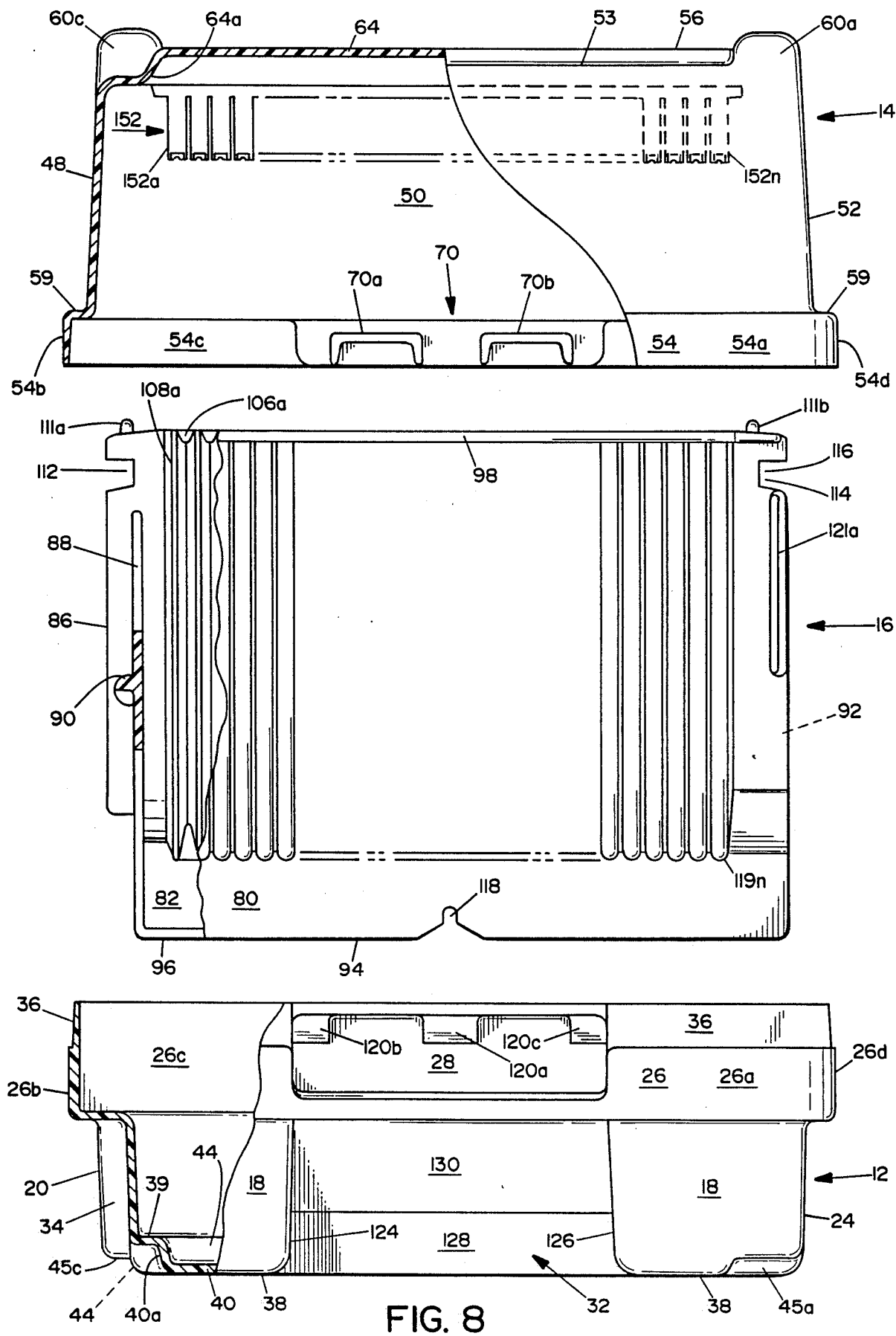
FIG. 8 illustrates a cutaway exploded side view in partial cross section of the substrate package.

FIG. 8 illustrates a cutaway exploded side view in partial cross section of the substrate package 10 prior to engagement where all numerals correspond to those elements previously described.

FIG. 9 illustrates a cutaway exploded end view in partial cross section of the substrate package 10 prior to engagement where all numerals correspond to those elements previously described. The bottom member 12 is a cross section taken along line 9-9 of FIG. 3.

Figure 10:
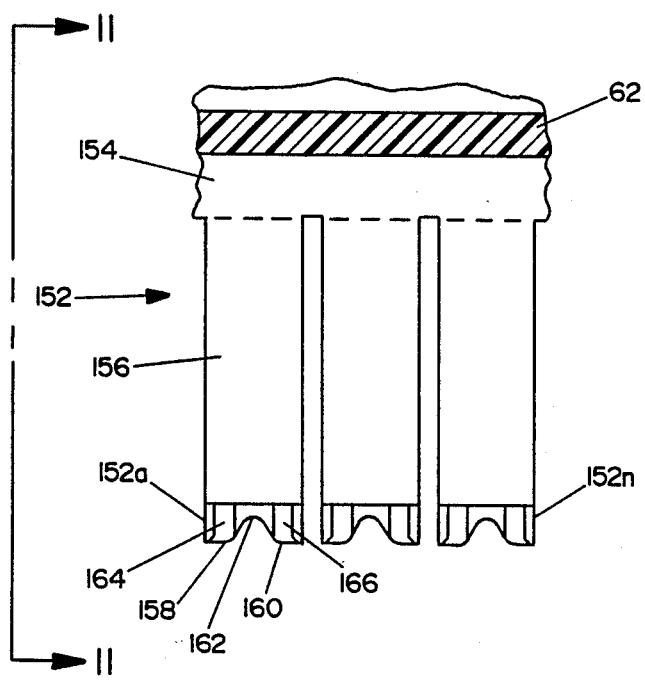
FIG. 10 illustrates an end view of the wafer support springs.
Figure 11:
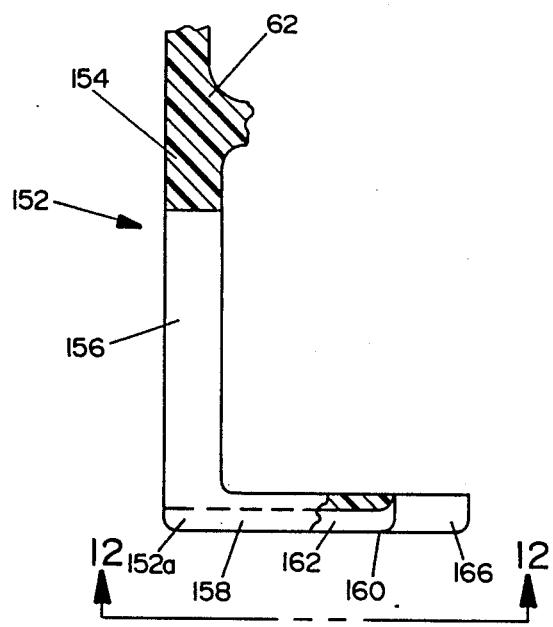
FIG. 11 illustrates a side view of the wafer support springs row.
Figure 12:
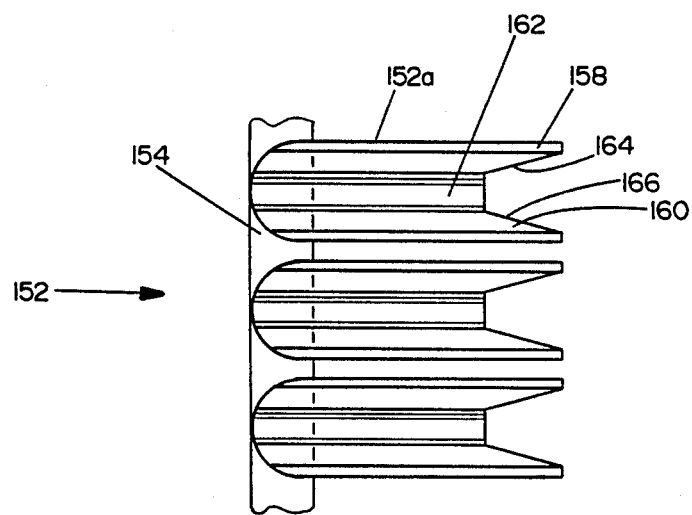
FIG. 12 illustrates a bottom view of the wafer support springs.

FIG. 10 illustrates the wafer support springs 152a-152n in the wafer support spring row 152 where the spring tooth 152a is described in detail. A longitudinal bar member 154 extends horizontally from the planar surface 62, and a vertically oriented bar member 156 extends downwardly from the longitudinal bar member 154. The flexible wafer support spring 152a extends horizontally from the lower portion of the vertical bar member 156 as illustrated in FIG. 11. The flexible wafer support spring 152a includes ramped angulated walls 158 and 160 forming a two bar articulated linkage member. A "V" groove 162 extends between the ramped angulated walls 158 and 160 to angled ends 164 and 166 and along the underside of the flexible spring tooth 152a as also illustrated in FIG. 12. The flexible wafer support springs 152a-152n are pliable, and have predetermined flexibility to engage the circumferential edges of wafer substrates in the "V" groove 162 between ramped angulated wall members 158 and 160 contained in the substrate package 10. The wafer support springs make contact with the wafer or substrate and flex the wafer support springs.

FIG. 11 illustrates a side view of the wafer support spring row 152 of FIG. 10 along line 11—11 of FIG. 10 where all numerals correspond to those elements previously described.

FIG. 12 illustrates a bottom view of the wafer support spring row 152 of FIG. 11 taken along line 12—12 of FIG. 11.

FIG. 13 illustrates a top view of the wafer carrier 16 where all numerals correspond to those elements previously described.

FIG. 14 illustrates a sectional view of the divider ribs including tooth 106n and wafer slot 108n taken along line 14-14 of FIG. 13. The tip of the rib 102n, as well as the wafer slot 108n, is smooth and rounded.

Figure 15:
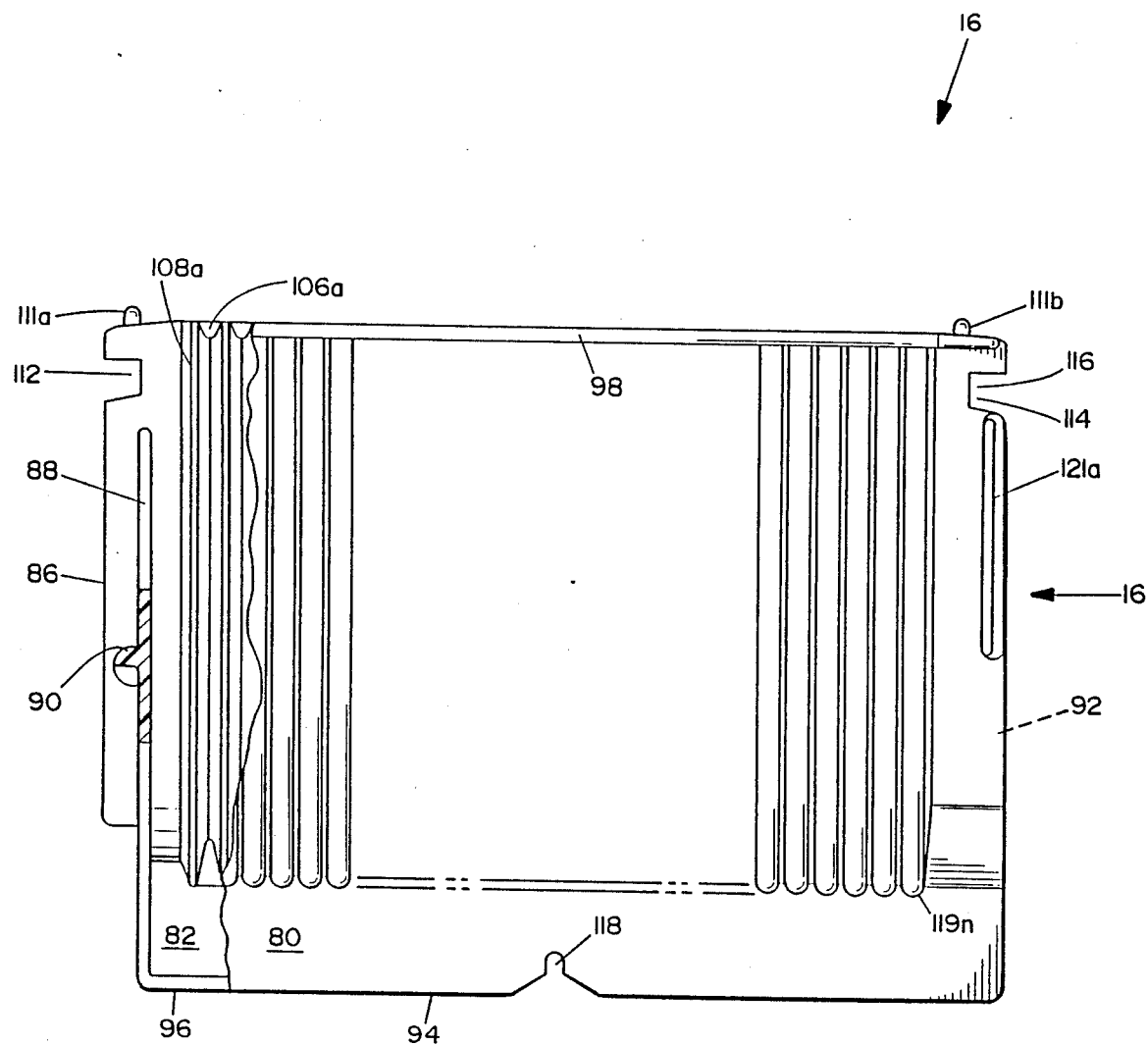
FIG. 15 illustrates a cutaway view of a wafer carrier.

FIG. 15 illustrates a cutaway side view of the wafer carrier 16 where all numerals correspond to those elements previously described.

MODE OF OPERATION

Figure 16:
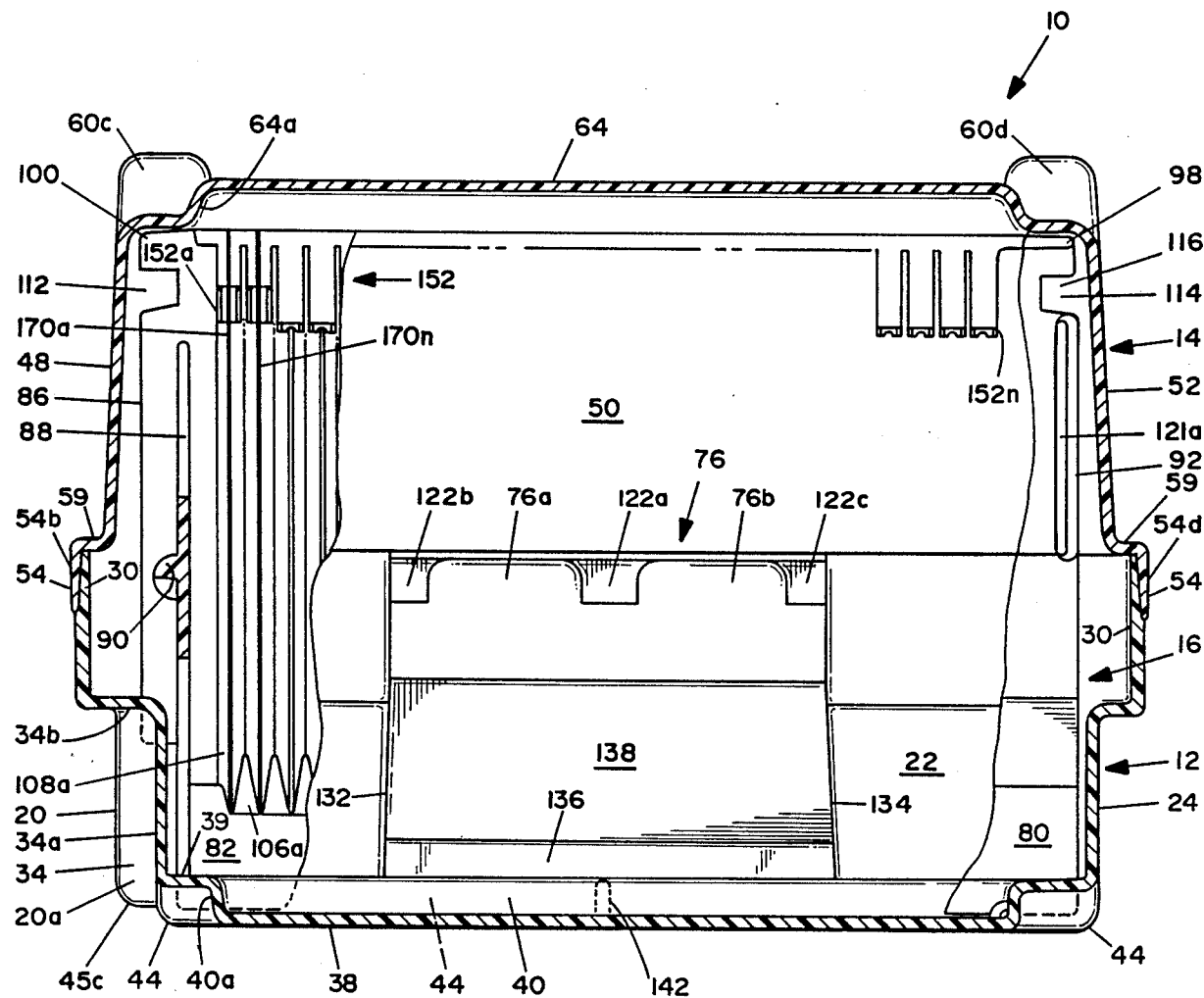
FIG. 16 illustrates a cutaway side view of substrate wafers in the substrate package.

FIGS. 16 and 17 best illustrate the mode of operation.

FIG. 16 illustrates a cutaway side view of substrates or wafers 170a-170n engaged in the package 10 where all numerals correspond to those elements previously described. The top member 14 and the bottom member 12 are illustrated in full cross section. The wafer carrier 16 is cutaway for view of the latch member 76 above the oblique wall 138. The latch recess 30 seals against the continuous vertical lip member 54. The robotic wafer carrier can be for shipping and storage, and/or processing, and can be of a suitable polymer such as polyethylene, Teflon, or other like materials.

FIG. 17 illustrates the cross section of the top and bottom members 14 and 12, respectively, engaged with one another over the substrates or wafers 170a-170n in the wafer carrier 16 where all numerals correspond to those elements previously described. The catch members 70 and 72 are illustrated frictionally engaging latch members 74 and 76 whereby continuous lip members 36a-36b firmly contact the continuous planar rim 59 to seal the top and bottom members 14 and 12 in the area of the catch members 70 and 72 and latch members 74 and 76. Particularly illustrated in the drawing is the interlocking and interengaging relationship of the wafer carrier 16 with respect to the top member 14 and the bottom member 12 with the substrates or wafers 170a-170n engaged between the wafer carrier 16, the top member 14 and the bottom member 12. The substrates or wafers 170a-170n are engaged between the plurality of teeth 106a-106n and opposing ribs 102a-102n which limits defined movement so that each substrate or wafer is in the center of each pair of divider teeth members.

The wafer carrier 16, including the substrates or wafers 170a-170n, are first placed in the bottom member 12 so that the bottom edges 94 and 96 rest in channels 42 and 46 of the bottom member 12. The top member 14 is then positioned over the carrier containing the substrates or wafers 170a-170n. The continuous vertical lip member 54 of the top member 14 aligns over the continuous lip member 36 as also illustrated in FIG. 1. Then, the flexible wafer support springs 150a-150n and 152a-152n position tangentially in flexing engagement against the circumference of the substrates or wafers 170a-170n, and the ramped catches 70a-70b and 72a-72b partially engage against the latch members 74 and 76. The top member 14 is positioned incorporating slightly more downward pressure against the substrates or wafers 170a-170n by the plurality of wafer support springs 150a-150n and 152a-152n, which move upwardly as illustrated until the catch surfaces 74a-74b and 76a-76b fully engage the catches 70 and 72 as the top member 14 centers over the substrates or wafers 170a-170n. The upper portion of the substrates or wafers 170a-170n locate in the "V" groove 162 between the ramped angulated walls 158 and 160 to assist in uniform lateral spacing of the upper portions of the substrate wafers with respect to each other. The "V" groove 162 between the angled ends 164 and 166 assist in capture of the upper substrate or wafer circumferential surfaces.

The top member 14 engages the wafer carrier 16 when the catch members 70 and 72 frictionally engage latch members 74 and 76, holding the wafer carrier 16 securely between the top and bottom members 14 and 12, respectively. More specifically, the planar members 53 and 55 contact and exert uniform downward pressure upon the planar top edges 98 and 100 of the wafer carrier 16. This exerted downward pressure is transmitted through the structure of the wafer carrier 16 to the wafer carrier bottom edges 94 and 96 which are seated in channels 42 and 44 of the bottom member 12, and is also transmitted to the channels 42 and 44 and the bottom member 12 in general.

The flexible wafer support springs 150a-150n and 152a-152n gently contact the circumference of each of the substrates or wafers 170a-170n respectively in a tangential fashion to ensure seating of the substrates or wafers 170a-170n within the wafer carrier 16 and within the engaged top and bottom members 14 and 12 to minimize movement of the substrates or wafers 170a-170n.

Both the wafer carrier 16 and the substrates or wafers 170a-170n are held in position by the top member 14 and the elements thereof. The spring action secures the substrates or wafers within the wafer carrier 16 and also provides an upward pressure towards the top member 14 with respect to the bottom member 12 so that when the catches and latches are disengaged from each other, the top member 14 is sprung upwardly by the action of the wafer support springs 150a-150n and 152a-152n against the substrates or wafers.

Figure 18:
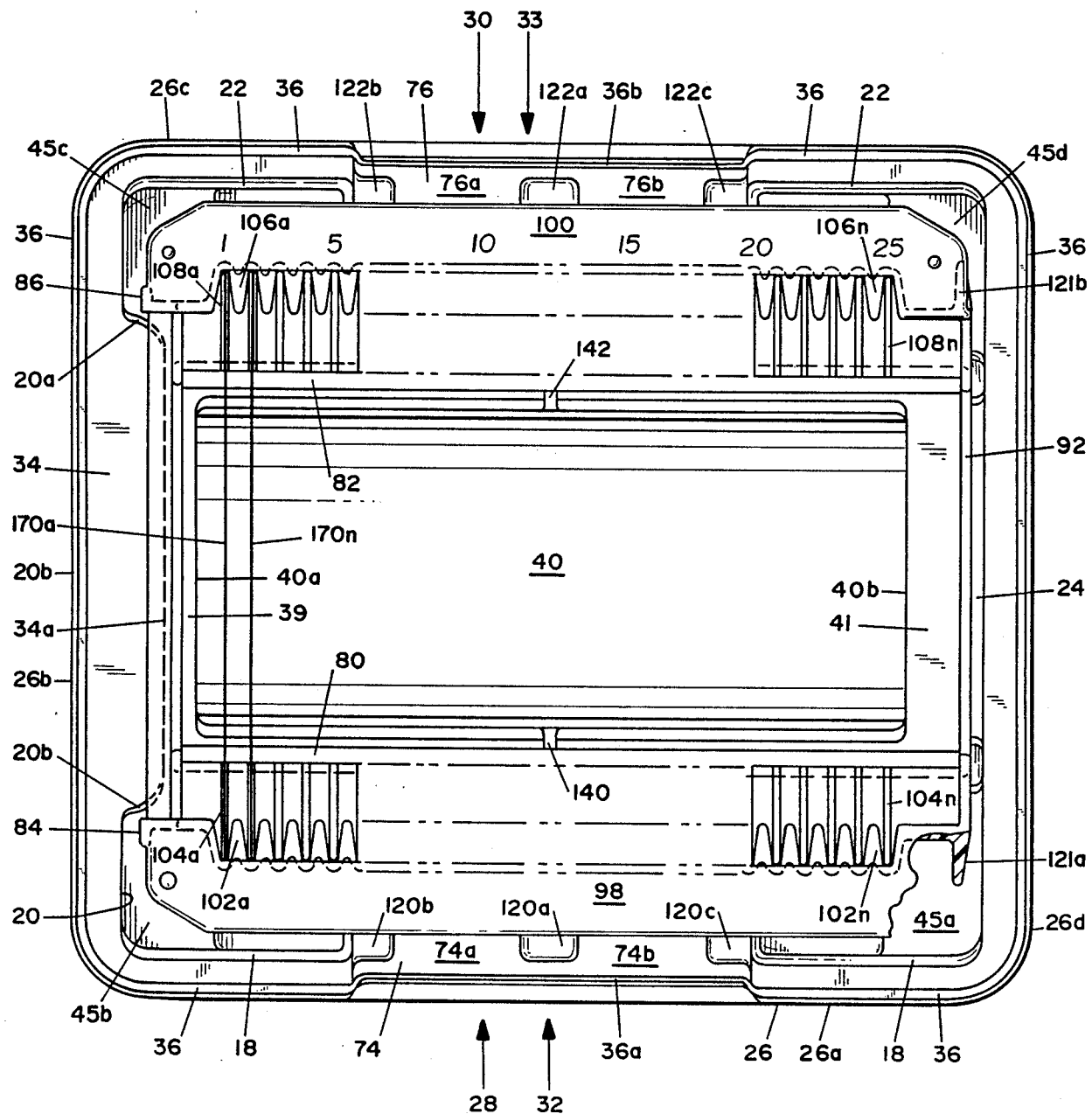
FIG. 18 illustrates a top vieW of a wafer carrier in the bottom member.

FIG. 18 shows that the wafer carrier 16 can be properly oriented and aligned in only one position with respect to the bottom member 12. The locating recess index member 34 allows only one proper orientation. The "H" shaped member 88 of the wafer carrier 16 engages over the locating recess index member 34. The vertical support bars 84 and 86 position around and about the locating recess index member 34. At the same time, planar member 92 of the wafer carrier 16 is closely juxtaposed with respect to the side 24. If the wafer carrier 16 is rotated 180° in either direction about its vertical axis, the planar member 92 of the wafer carrier 16 would have to fit in the area occupied by the locating recess index member 34 in order for the wafer carrier 16 to fit in the bottom member 12. Of course, the area of the "H" shaped member 88 below the segmented rod half 90 and between the vertical support bars 84 and 86 is accommodated by the locating recess index member 34.

It is noted that the top member 14 can be placed with either of its ends adjacent to either end of the bottom member 12.

The upper lips engage about the lower lips and the latches with the catches, and the interengaging relationship between the carrier, the bottom member 12 and the top member 14 about the substrates or wafers 170a–170n occurs during engagement. This interengaging relationship particularly reflects that the package is a synergistic combination which reduces and eliminates contamination of the wafers, as well as providing for storage and transportation of the substrates or wafers and providing a flush perimeter for taping of the top and bottom member 14 and 12, respectively, providing for secure shipping and storage. It is noted that the top member 14 aligns loosely with the bottom member 12 before the wafer support springs 150a–150n and 152a–152n align the substrates or wafers 170a–170n in the wafer carrier 16 on the center line of the divider ribs 102a–102n and teeth 106a–106n.

It is also particularly important to note that the latches are flush, providing that the container is suitable not only of being taped, but shrink-wrapped or bagged with some suitable type of polyester, polyethylene or mylar film, further providing a noncontaminate, closed container with structural integrity. This also reduces the cost of the container and maintains structural integrity of the wafers supported therein. The wafer carrier with respect to the top member and bottom member engages with the respective components so that the substrates or wafers are in frictional engagement with the entire substrate package.

Figure 19:
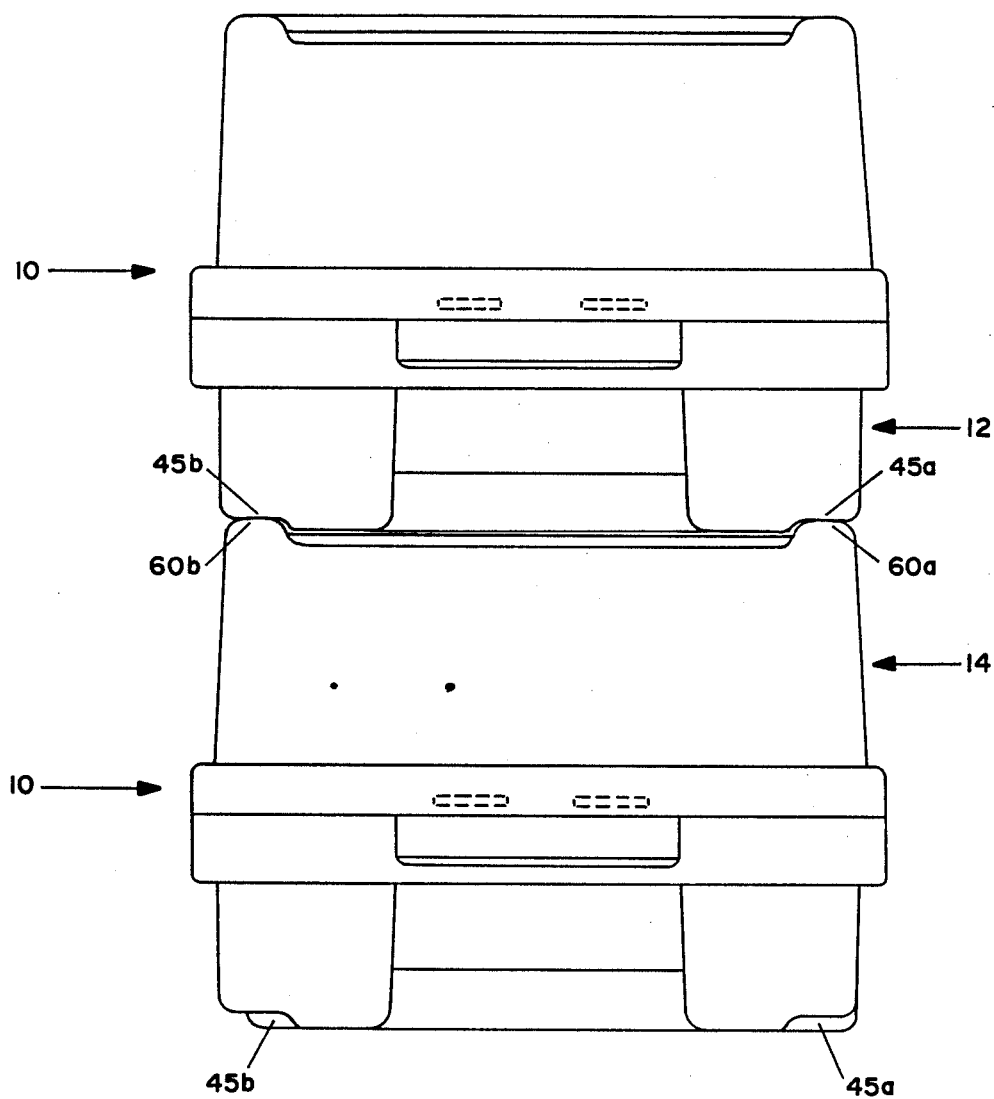
FIG. 19 illustrates stacked substrate packages.

FIG. 19 illustrates a side view of like substrate packages 10 stacked one upon another where all numerals correspond to those elements previously described. Like packages can be stacked by engagement of the stacking corner recess members 45a–45d of the bottom member 12 with the stacking feet 60a–60d of the top member 14 of another upper substrate package 10.

DESCRIPTION OF THE ALTERNATIVE EMBODIMENT

Figure 20:
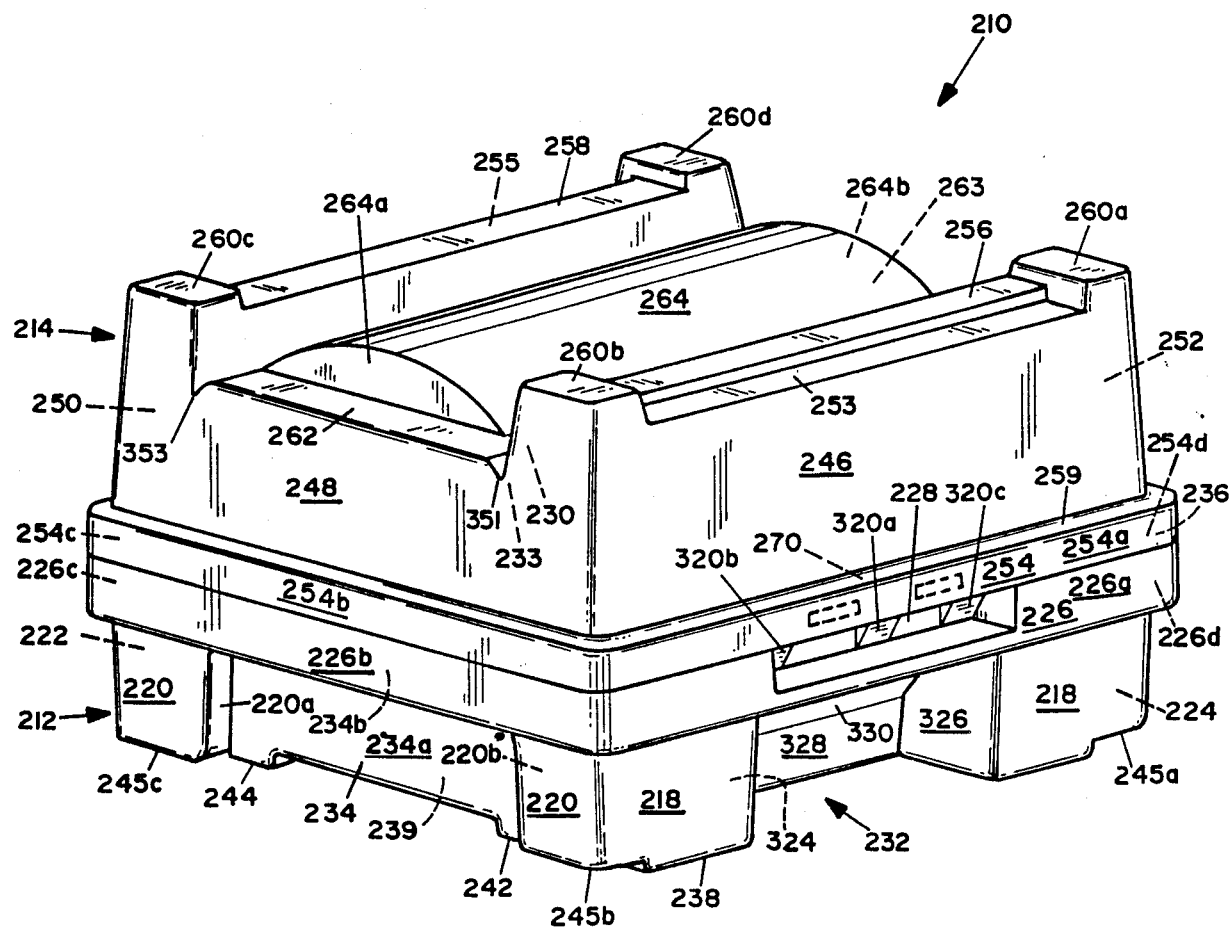
FIG. 20 illustrates a perspective view of an alternative embodiment substrate package.

FIG. 20 illustrates a perspective view of a package 210, the present invention, for the storage and transportation of substrates or wafers. The package includes a bottom member 212 and a top member 214 engaged to environmentally contain and transport or store a wafer carrier 216, which is illustrated in FIG. 21.

Figure 22:
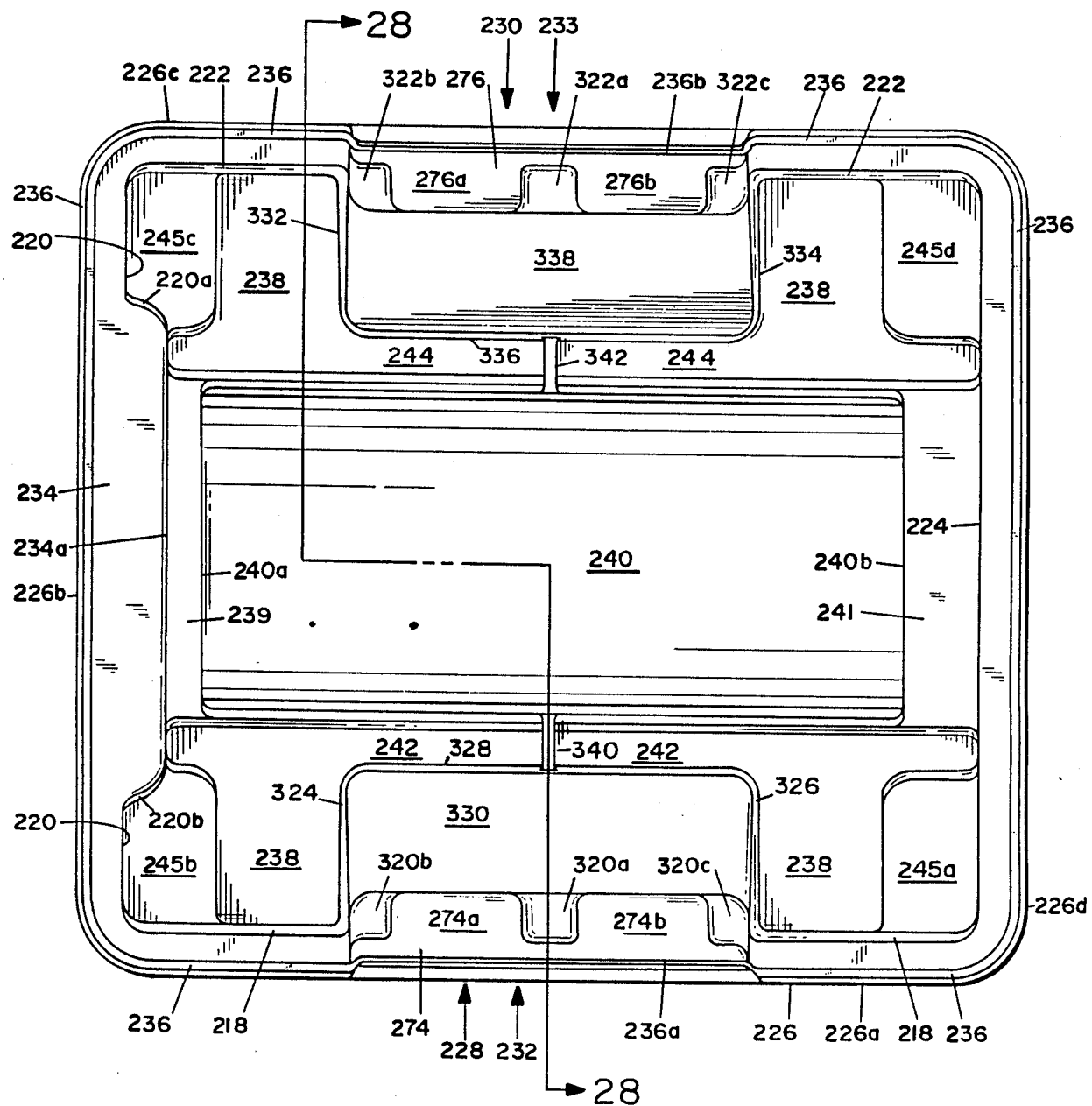
FIG. 22 illustrates a top view of the bottom member.

The bottom member 212 includes sides 218, 220, 222 and 224; a continuous vertical member 226 for taping, including planar surfaces 226a, 226b, 226c and 226d with rounded vertical corners therebetween; and a latch recess 228 located within the planar surface 226a and a corresponding latch recess 230 located within planar surface 226c. A handle recess 232 is set back from the side 218, and a like opposing recess 233 is set back from side 222 as illustrated in FIG. 22. A locating recess index member 234 for indexing a wafer carrier 216 is set back from side 220, and includes wall members 220a, 220b, wall member 234a between wall members 220a and 220b and a horizontal planar member 234b intersecting wall members 220a, 220b and 234a. A continuous lip member 236, as also illustrated in FIG. 22, locates at the upper portion of the continuous vertical member 226 to mate with a corresponding lip in the top member 214 as later described in detail. Upper planar bottom surfaces 239 and 241, with a cylindrical section member 240 including ends 240a and 240b disposed thereupon and extending downwardly from and between the upper planar surfaces 239 and 241, locates between the lower portions of the sides 220 and 224 as illustrated in FIG. 22. Channels 242 and 244 locate parallel to sides 218 and 220 along the lower planar bottom 238 and the long edges of the cylindrical section member 240 for accommodating the wafer carrier 216 as illustrated in FIG. 22. Stacking corner recess members 245a–245d position at the corresponding lower corner portions of the intersections of the sides 218–224 and the planar bottom 238.

Figure 25:
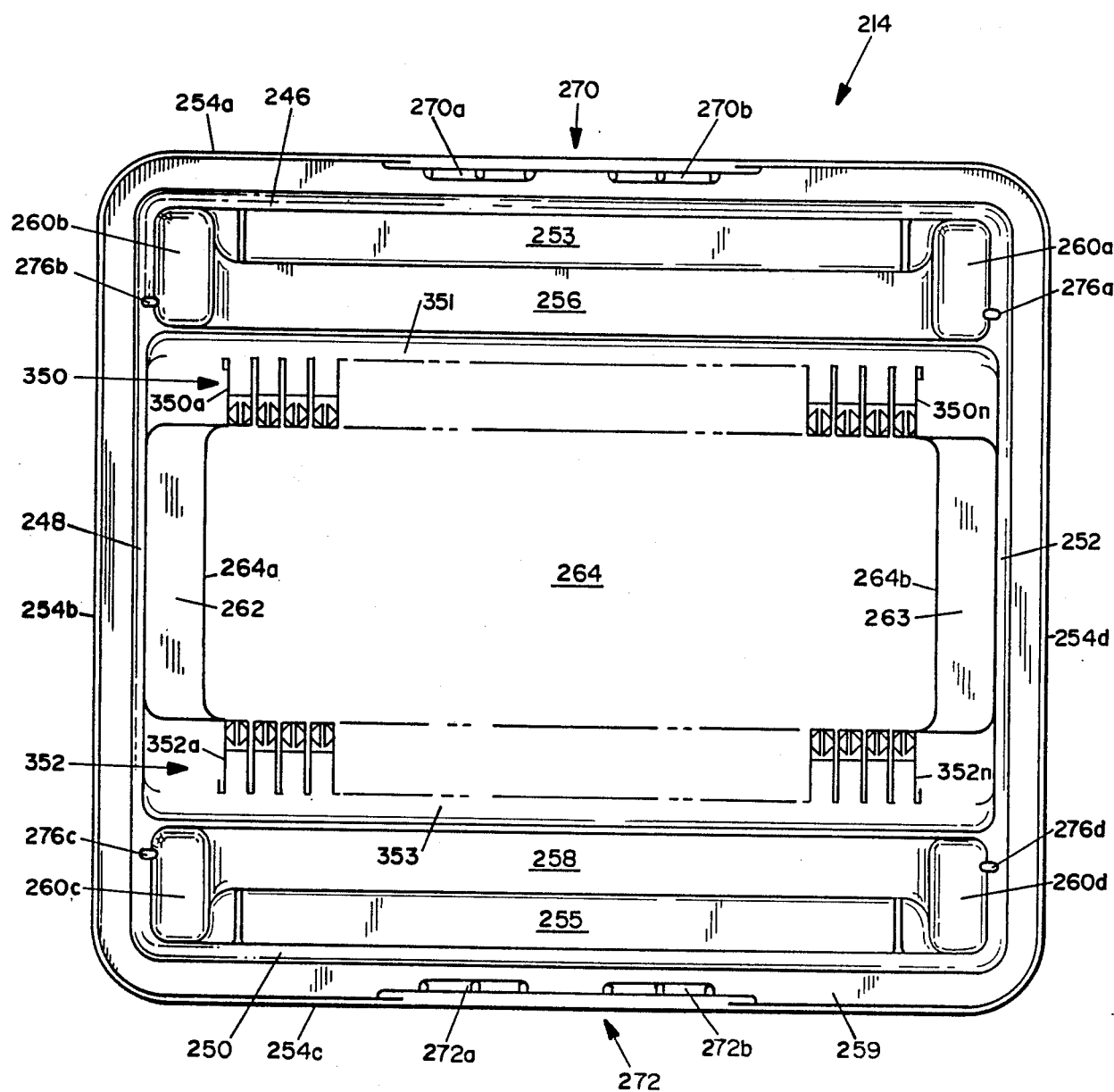
FIG. 25 illustrates a bottom view of the top member.
Figure 28:
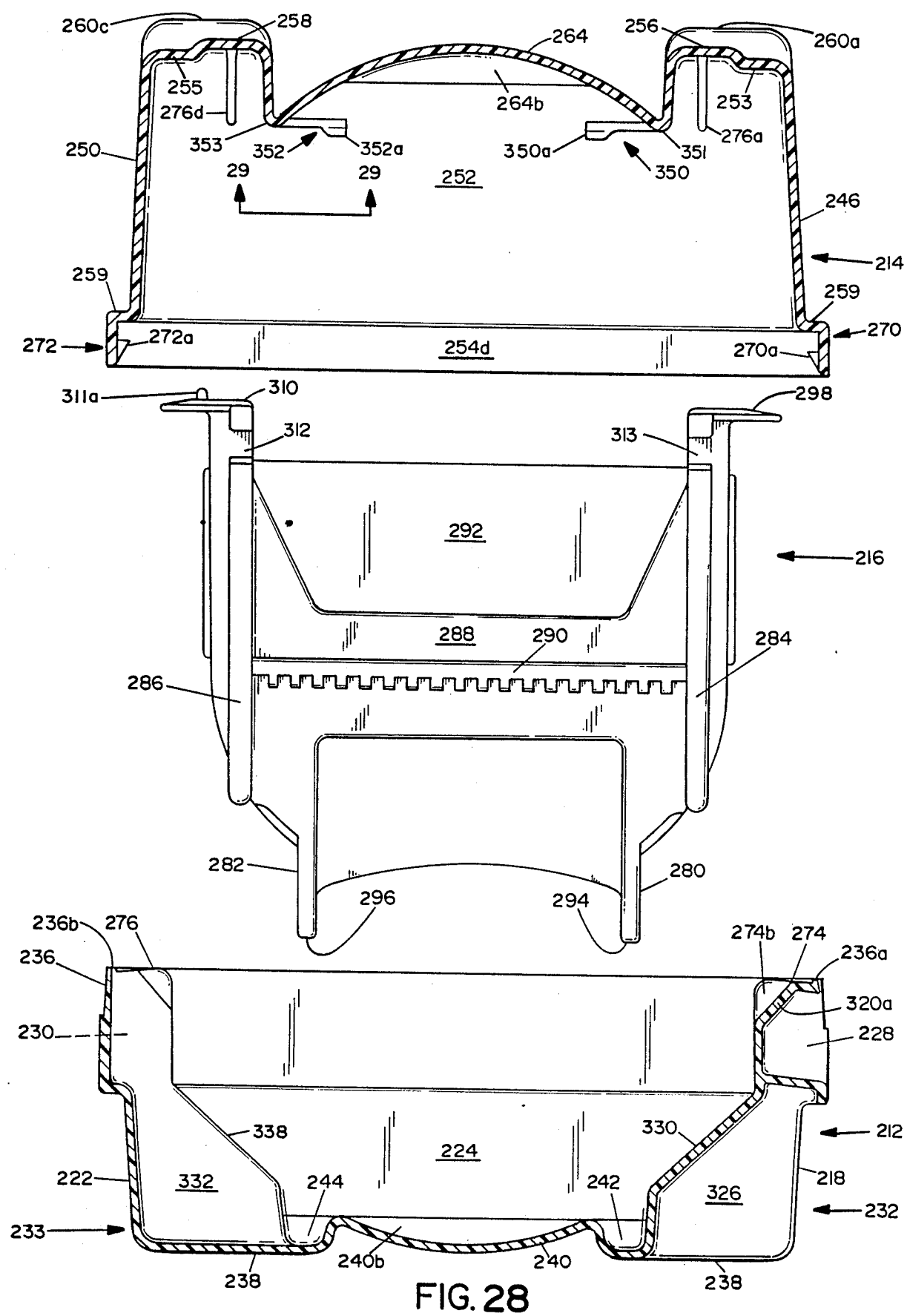
FIG. 28 illustrates an exploded cutaway end view in cross section of the substrate package.

The top member 214 includes sides 246–252; a continuous vertical lip member 254 extending downwardly from the sides 426–252 for taping, including planar surfaces 254a–254d with rounded vertical corners therebetween; channels 256 and 258 parallel to sides 246 and 250 at the upper portion of the sides 246 and 250, respectively, for engagement of the upper regions of the wafer carrier 216; planar members 253 and 255 adjacent to channels 256 and 258 and along the upper portions of the sides 246 and 250; stacking feet 260a–260d extending from and above the respective intersections of sides 246–252 and at respective opposing ends of the channels 256 and 258 as illustrated; an arced cylindrical section 264 extending between the channels 256 and 258 and the upper portions of the sides 248 and 252; and, cylindrical section ends 264a and 264b extending downwardly from the ends of the arced cylindrical section 264. Horizontally aligned planar surfaces 262 and 263 extend horizontally from the upper portions of the sides 248 and 252 and intersect the cylindrical section ends 264a and 264b. Rows of horizontally aligned wafer support springs extend downwardly from the underside of the planar surface to gently secure wafer substrates in the wafer carrier 216, as later described in detail in the figures, particularly in FIGS. 29–31. The continuous vertical lip member 254 fits over the continuous lip member 236 of the bottom member 212 to seal the substrate package 210. The top member 214 includes catch members 270 and 272 as illustrated in FIGS. 25 and 28, and the bottom member 212 includes latch members 274 and 276 each adjacent respectively to the handle recesses 232 and 233 for secure engagement of the top member 214 to the bottom member 212 containing the wafer carrier 216.

Figure 21:
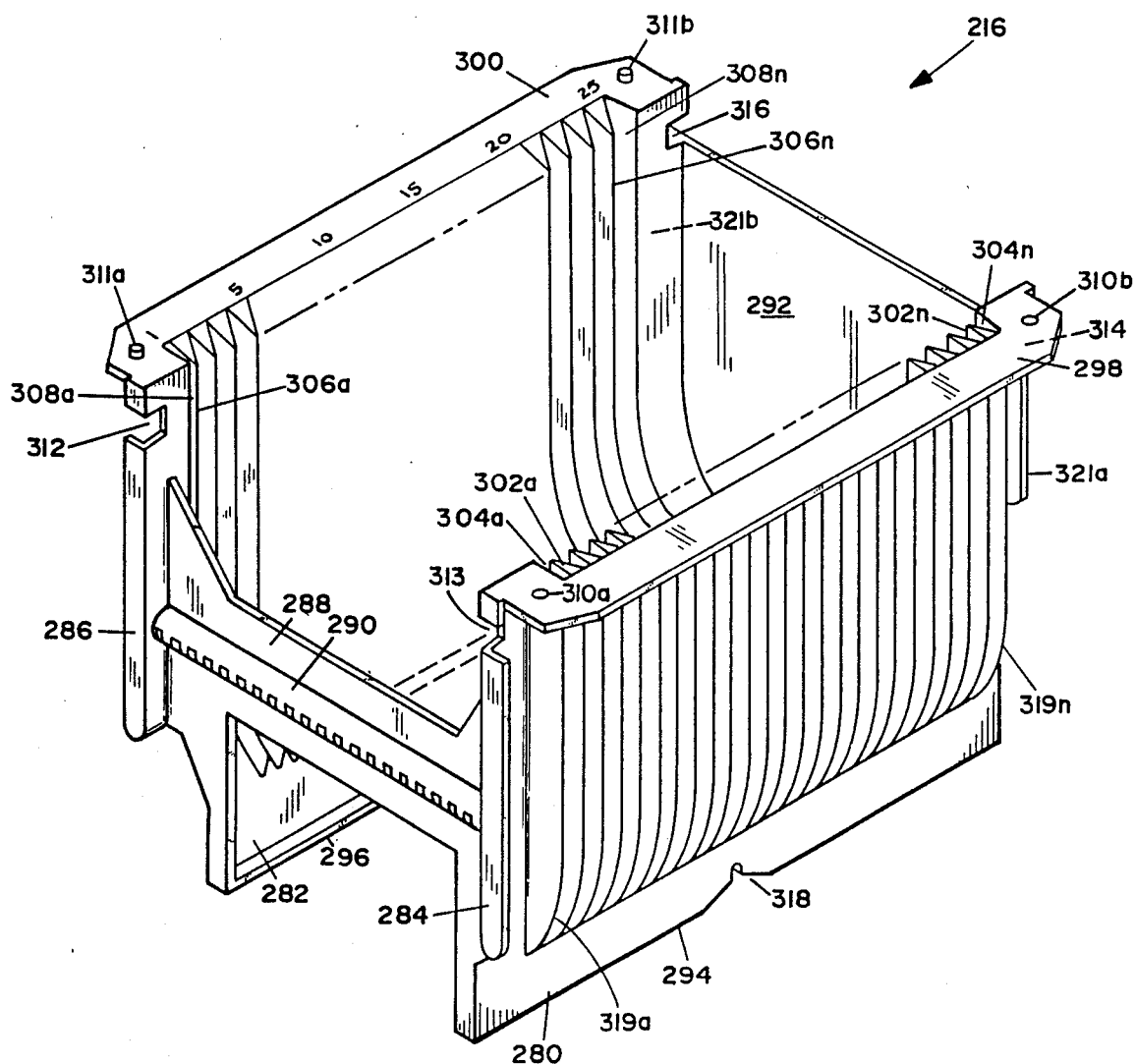
FIG. 21 illustrates a perspective view of a wafer carrier.
Figure 32:
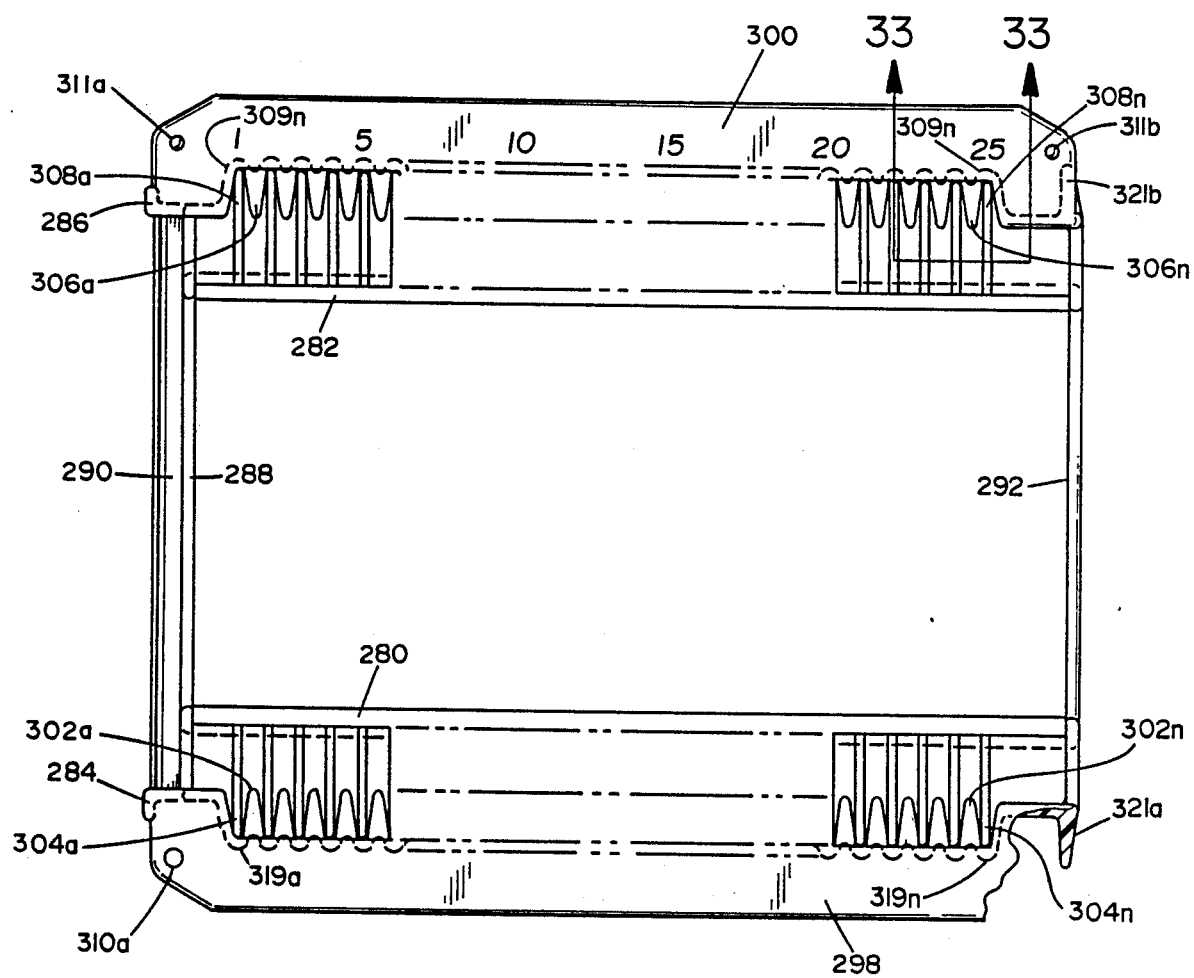
FIG. 32 illustrates a top view of a wafer carrier.
Figure 33:
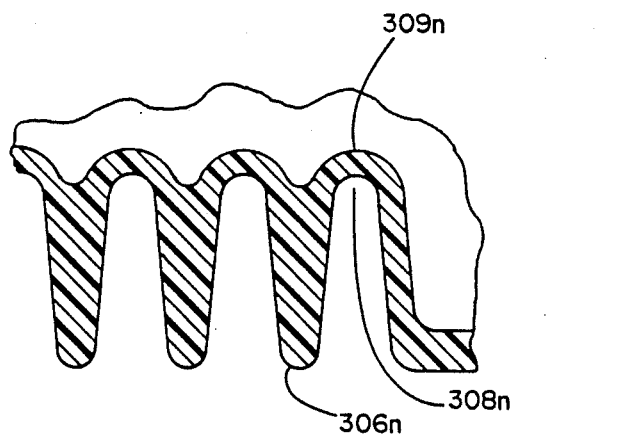
FIG. 33 illustrates a sectional profile view of the divider ribs and wafer pockets.

FIG. 21 illustrates a perspective view of the wafer carrier 216 including opposing sides 280 and 282; a support bar 284 extending vertically and outwardly along an end of side 280; a support bar 286 extending vertically and outwardly along an end of side 282; a configured "H" shaped member 288 and segmented rod half 290 between the support bars 284 and 286 and set back from the support bars 284 and 286; a vertically oriented planar member 292 between the rear portions and flush to the rear portions of sides 280 and 282; bottom edges 294 and 296 along the bottom portion of sides 280 and 282, respectively; a planar top edge 298 along the upper edge of side 280 and between the upper portion support bar 284 and the upper and outer portion of the planar member 292; and a like planar top edge 300 extending along the upper edge of side 282 between the upper portion of support bar 286 and the upper and outer portion of the planar member 292. Ribs 302a–302n and alternating wafer pockets 304a–304n extend vertically along the distance between the planar top edge 298 and the lower portion of side 280 near which point the ribs 302a–302n and the alternating wafer pockets 304a–304n assume a curved cross section to intersect with the lower portion of side 280. In a similar fashion, ribs 306a–306n and alternating wafer pockets 308a–308n extend vertically for the majority of the distance between the planar top edge 300 and the lower portion of side 282 near which point the ribs 302a–302n and the alternating wafer pockets 304a–304n assume a curved cross section to intersect with the lower portion of side 282. Rounded wafer pocket backs 309a–309n and 319a–319r provide for dimensional stability and extend similarly to assume a curved cross section to intersect with the lower portion of side 282, as also illustrated in FIGS. 32 and 33. The planar top edges 298 and 300 include vertically oriented positioning holes and slots 310a–310b and 311a–311b, respectively, near their outer extremities. The wafer carrier 216 also includes robotic handler slots 312 and 314 positioned in the support bars 284 and 286, respectively, and robotic handler slots 316 and 318 positioned at the rear of the wafer carrier 216 adjacent to the top edge of the planar member 292 and the upper portions of sides 280 and 282. Robotic tab members 321a and 321b position on the upper portion of the sides 280 and 282.

FIG. 22 illustrates a top view of the bottom member 212 where all numerals correspond to those elements previously described. The latch recess 228 includes a latch member 274 with an angulated central support member 320a and angulated support members 320b and 320c extending from the mid-portion of the latch member 274 angularly to the lower inner most area of the latch recess 228 as also illustrated in FIG. 20. The latch member 274 is divided into latch surfaces 274a and 274b by the angulated support member 320a. Corresponding angulated latch support members 322a–322c extend in a similar fashion from beneath the latch member 276 into the latch recess 230 located above the handle recess 233. The latch member 276 is divided into latch surfaces 276a and 276b by the angulated support member 322a. The handle recess 232 is illustrated including vertically aligned opposing walls 324 and 326, vertical wall 328 between walls 324 and 326, and an oblique wall 3?0 slanting toward the center of the bottom member 212 and intersecting walls 324–328. Handle recess 233 includes similarly oriented and aligned opposing walls 332 and 334, wall 336 between walls 332 and 334, and oblique wall 338 interesting walls 332–336. Locator ribs 340 and 342 extend respectively between walls 328 and 336 and the inner side members of channels 242 and 246 and aid in structural support.

Figure 23:
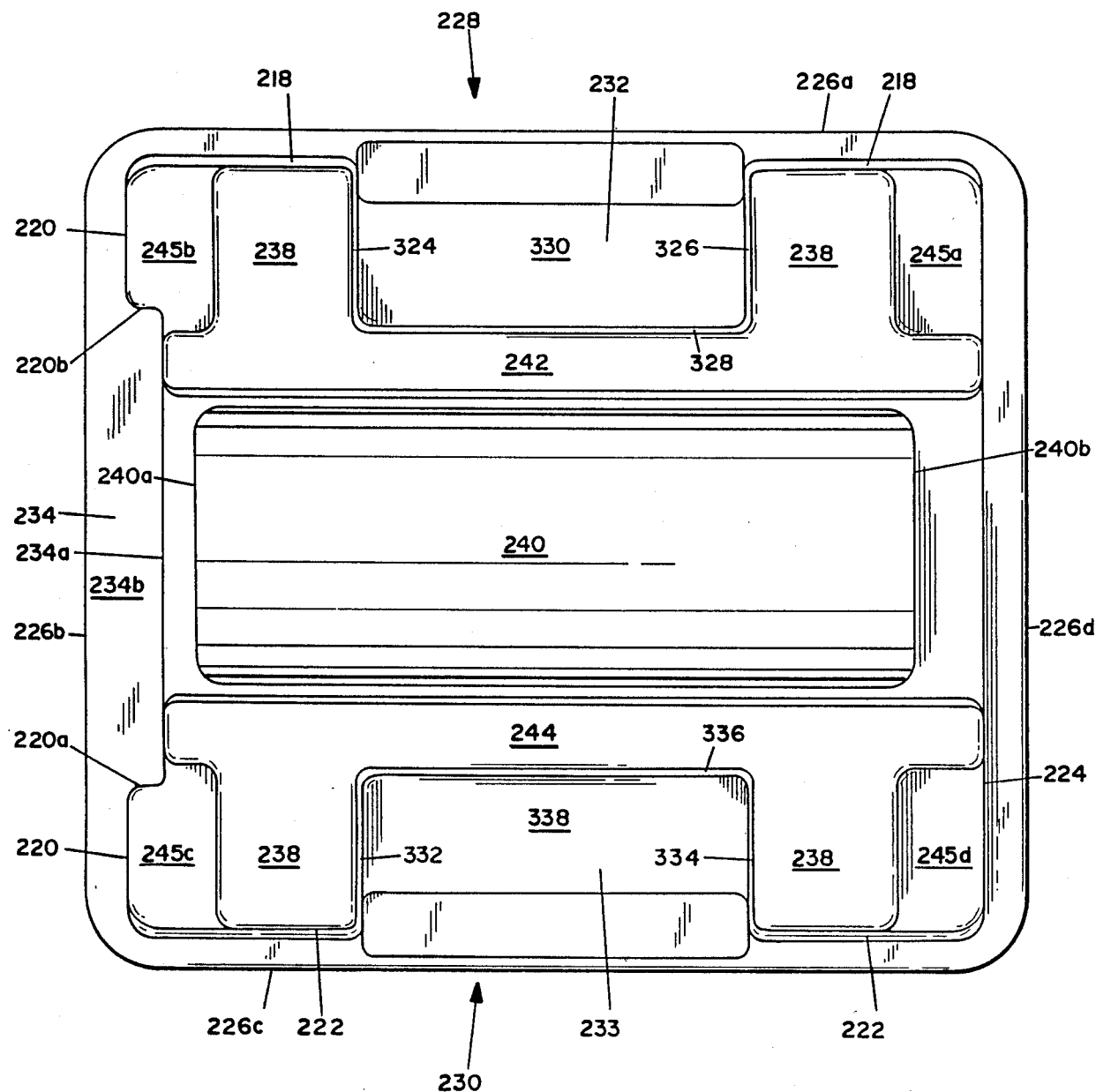
FIG. 23 illustrates a bottom view of the bottom member.

FIG. 23 illustrates a bottom view of the bottom member 212 where all numerals correspond to those elements previously described.

Figure 24:
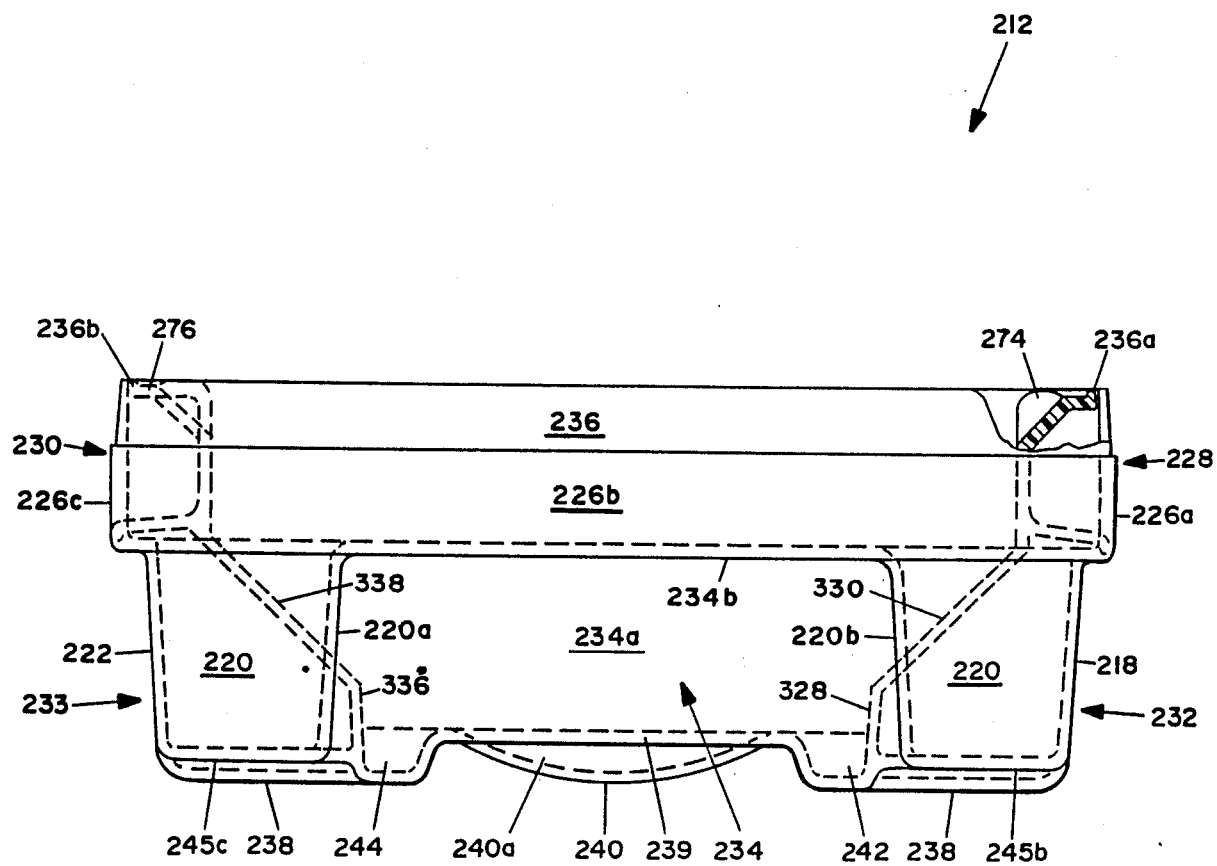
FIG. 24 illustrates an end view of the bottom member.
Figure 36:
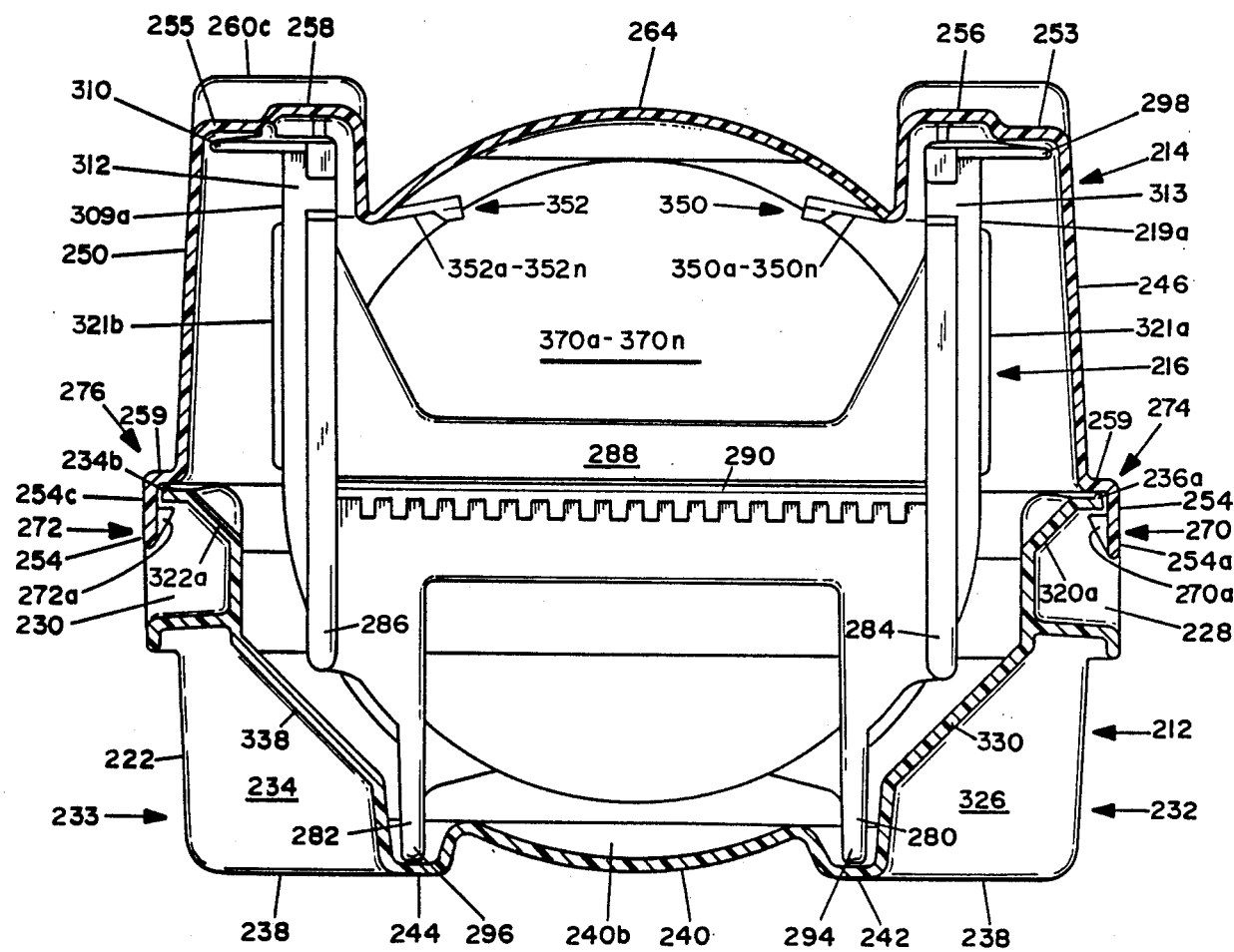
FIG. 36 illustrates a cross-sectional end view of the assembled substrate package.

FIG. 24 illustrates an end view of the bottom member 212 where all numerals correspond to those elements previously described. Illustrated in particular is the locating recess index member 234 in side 220. The profile of the continuous lip member 236 is illustrated as 236a and 236b, where the continuous lip member 236 passes through the areas adjacent to the latch members 274 and 276, respectively. Lips 236a and 236b seal against the horizontal undersides of the continuous planar rim 259 on the package top as illustrated in FIG. 36.

Figure 26:
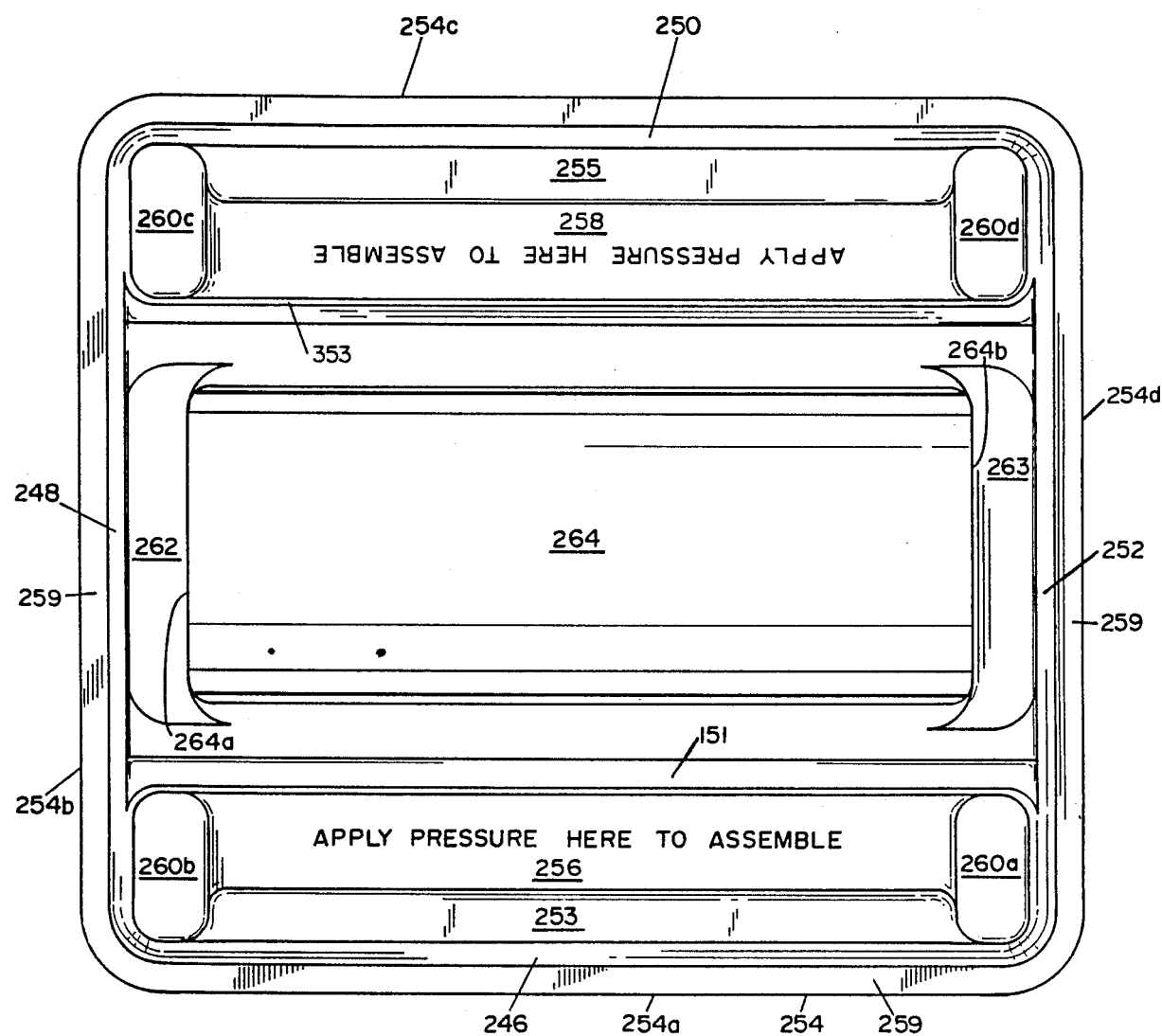
FIG. 26 illustrates a top view of the top member.

FIG. 25 illustrates a bottom view of the top member 214 where all numerals correspond to those elements previously described. Rows of flexible wafer support springs 350 and 352, also referred to as articulated cantilevered horizontal arms, extend horizontally from the small radiused surfaces 351 and 353 which are transitions between the arced cylindrical section 264 and the channels 256 and 258, as also illustrated in FIG. 28, to gently secure wafer substrates carries in the wafer carrier 216. The flexible wafer support spring rows 350 and 352 include a plurality of wafer support spring arms or articulated cantilevered horizontal arms 350a–350n and 352a–352n, respectively, and are illustrated and described further in FIGS. 29, 30, and 31. Catch members 270 and 272 position on the planar surfaces 254a and 254c, respectively. Catch member 270 includes ramped catches 270a and 270b, and catch member 272 includes ramped catches 272a and 272b. The catch members 270 and 272 of the top member 214 engage the latch members 274 and 276 of the bottom member 212 as illustrated in FIG. 26. Strengthener struts 276a–276d are vertically aligned on the inner surface of walls 248 and 252.

FIG. 26 illustrates a top view of the top member 214 where all numerals correspond to those elements previously described.

Figure 27:
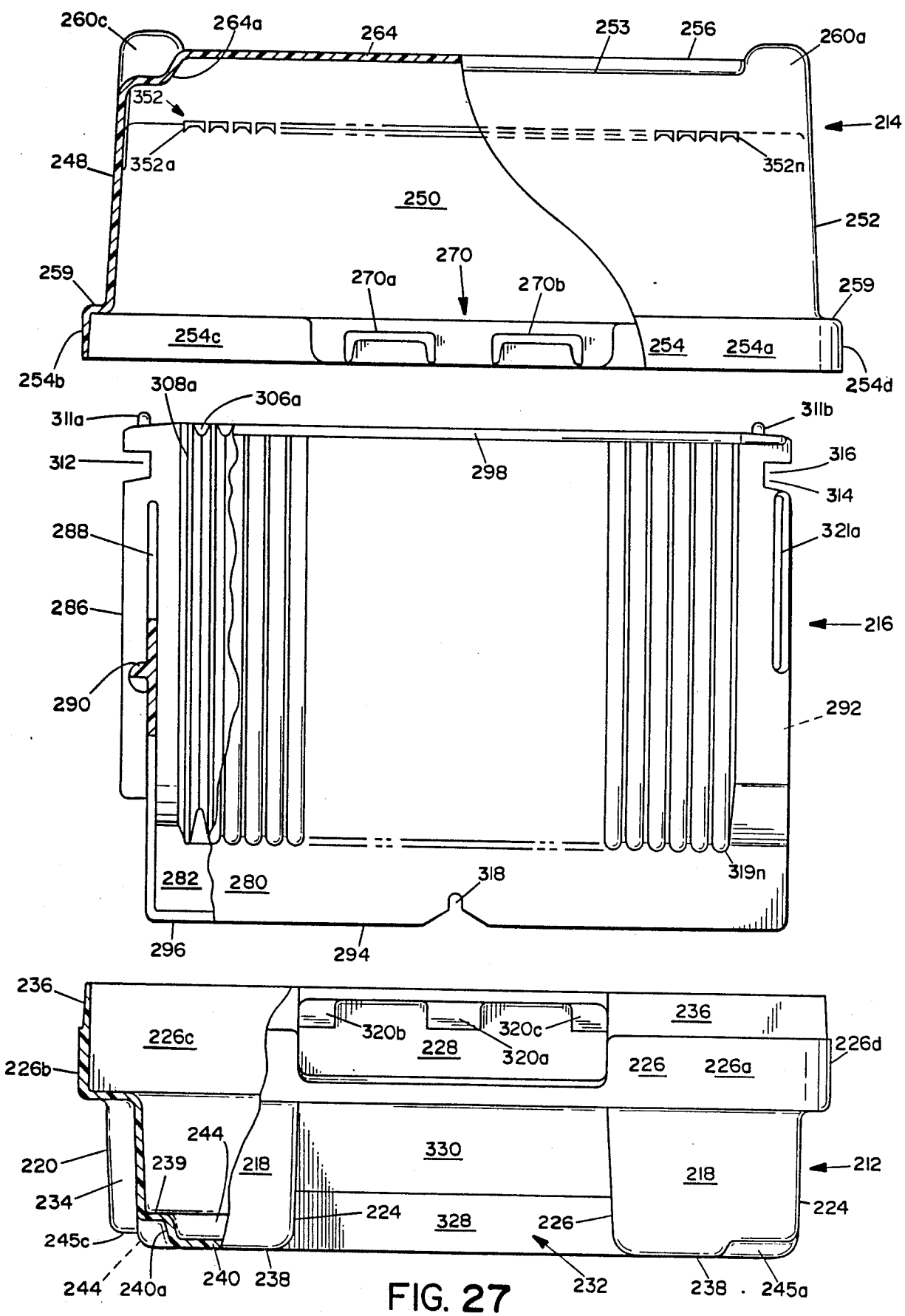
FIG. 27 illustrates a cutaway exploded side view in partial cross section of the substrate package.

FIG. 27 illustrates a cutaway exploded side view in partial cross section of the substrate package 210 prior to engagement where all numerals correspond to those elements previously described.

FIG. 28 illustrates a cutaway exploded end view in partial cross section of the substrate package 210 prior to engagement where all numerals correspond to those elements previously described. The bottom member 212 is a cross section taken along line 28—28 of FIG. 22.

Figure 29:
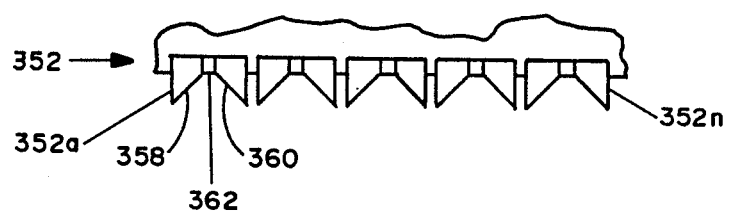
FIG. 29 illustrates an end view of the wafer support springs.
Figure 30:
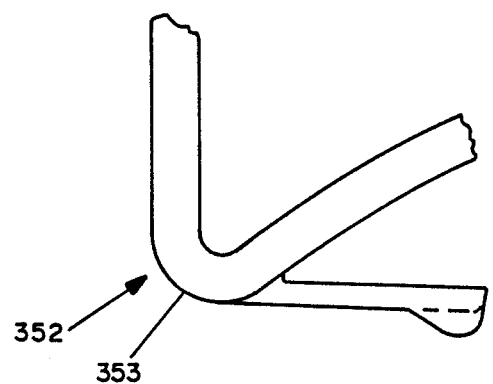
FIG. 30 illustrates a side view of the wafer support springs row.
Figure 31:
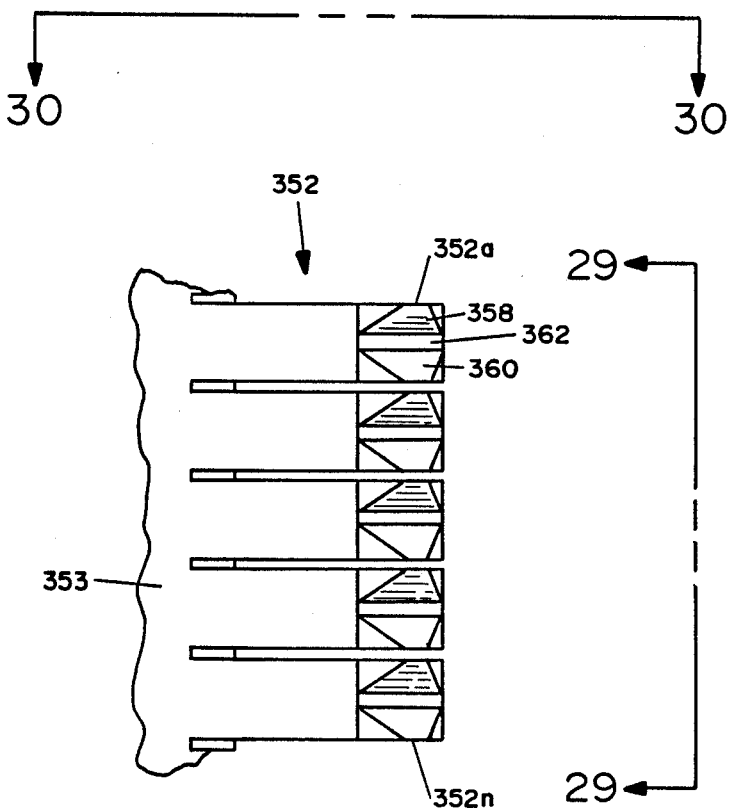
FIG. 31 illustrates a bottom view of the wafer support springs.

FIG. 29 illustrates an end view along line 29—29 of FIG. 28 of the wafer support springs 352a–352n in the wafer support spring row 352 where the spring tooth 352a is described in detail. The flexible wafer support spring 352a extends horizontally from the small radius surface 356 as illustrated in FIG. 31. The flexible wafer support spring 352a includes ramped angulated walls 358 and 360. A "V" groove 362 extends between the ramped angulated walls 358 and 360 along the underside of the flexible spring tooth 352a as also illustrated in FIG. 30. The flexible wafer support springs 352a–352n are pliable, and have predetermined flexibility to engage the circumferential edges of wafer substrates in the "V" groove 362 between ramped angulated wall members 358 and 360 contained in the substrate package 210. The wafer support springs make contact with the wafer or substrate and flex the wafer support springs.

FIG. 30 illustrates a side view of the wafer support spring row 352 of FIG. 29 along line 30—30 of FIG. 29 where all numerals correspond to those elements previously described.

FIG. 31 illustrates a bottom view of the wafer support spring row 352 of FIG. 30 taken along line 31—31 of FIG. 29.

FIG. 32 illustrates a top view of the wafer carrier 216 where all numerals correspond to those elements previously described.

FIG. 33 illustrates a sectional view of the divider ribs including tooth 306n and wafer slot 308n taken along line 33—33 of FIG. 32. The tip of the rib 302n, as well as the wafer slot 308n, is smooth and rounded.

Figure 34:
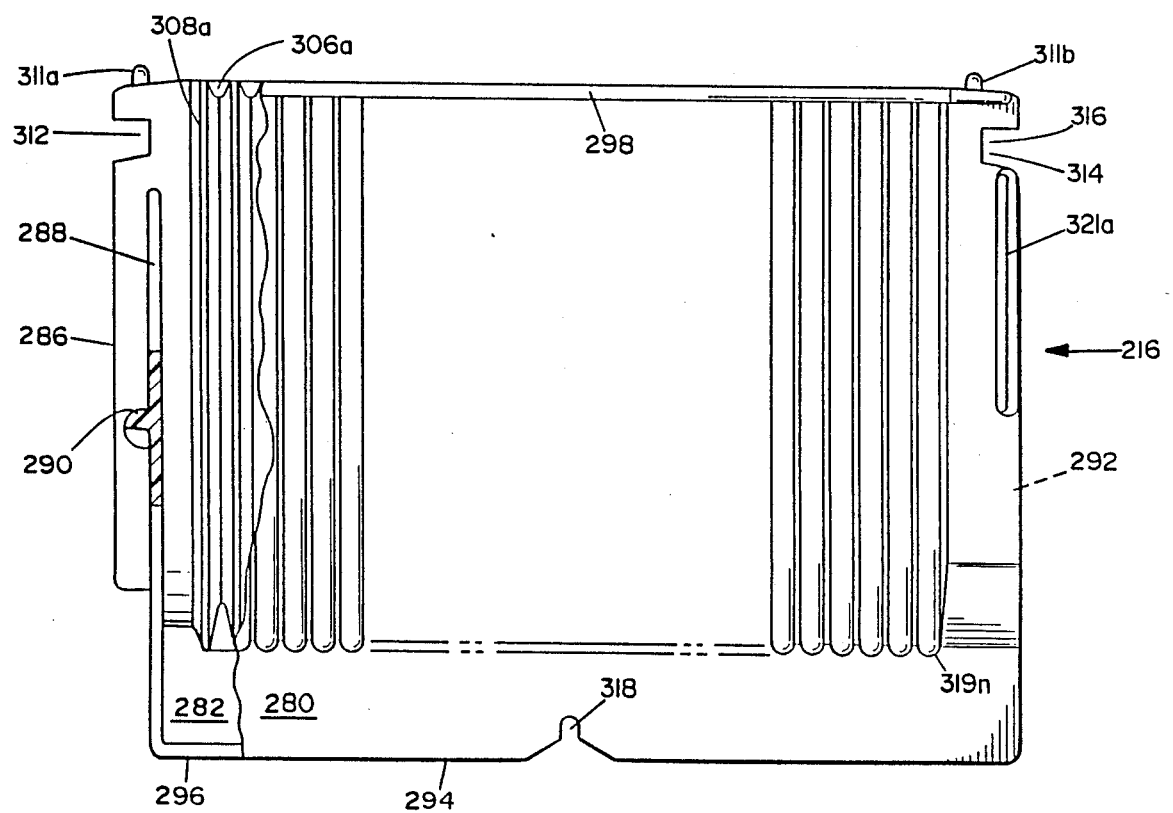
FIG. 34 illustrates a cutaway view of a wafer carrier.

FIG. 34 illustrates a cutaway side view of the wafer carrier 216 where all numerals correspond to those elements previously described.

MODE OF OPERATION OF THE ALTERNATIVE EMBODIMENT

Figure 35:
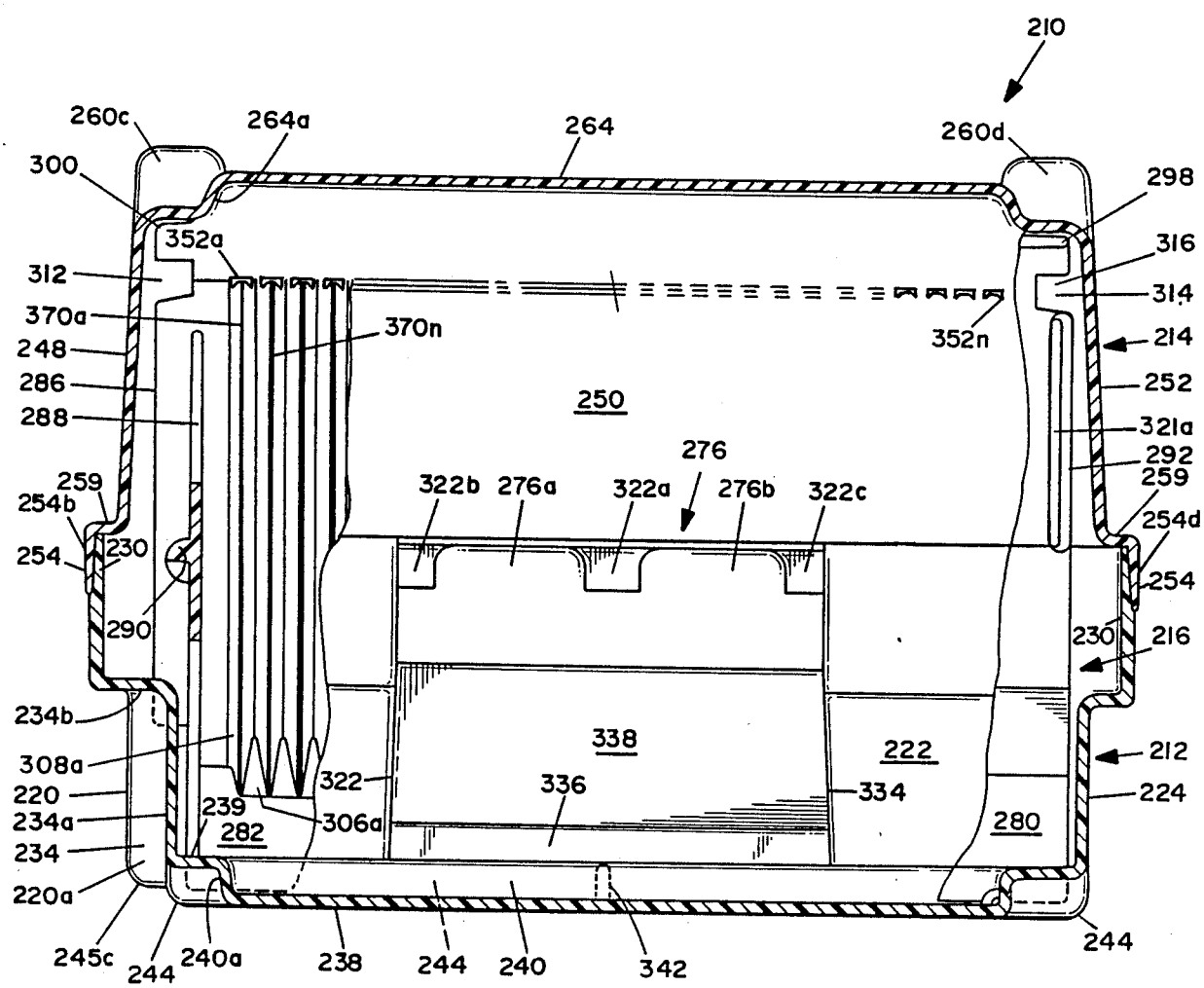
FIG. 35 illustrates a cutaway side view of substrate wafers in the substrate package.

FIGS. 35 and 36 best illustrate the mode of operation.

FIG. 35 illustrates a cutaway side view of substrates or wafers 370a–370n engaged in the package 210 where all numerals correspond to those elements previously described. The top member 214 and the bottom member 212 are illustrated in full cross section. The wafer carrier 216 is cutaway for view of the latch member 276 above the oblique wall 338. The latch recess 230 seals against the continuous vertical lip member 254. The robotic wafer carrier can be for shipping and storage, and/or processing, and can be of a suitable polymer such as polyethylene, Teflon, or other like materials.

FIG. 36 illustrates the cross section of the top and bottom members 214 and 212, respectively, engaged with one another over the substrates or wafers 370a–370n in the wafer carrier 216 where all numerals correspond to those elements previously described. The catch members 270 and 272 are illustrated frictionally engaging latch members 274 and 276 whereby continuous lip members 236a–236b firmly contact the continuous planar rim 259 to seal the top and bottom members 214 and 212 in the area of the catch members 270 and 272 and latch members 274 and 276. Particularly illustrated in the drawing is the interlocking and interengaging relationship of the wafer carrier 216 with respect to the top member 214 and the bottom member 212 with the substrates or wafers 370a–370n engaged between the wafer carrier 216, the top member 214 and the bottom member 212. The substrates or wafers 370a–370n are engaged between the plurality of teeth 306a–306n and opposing ribs 302a–302n which limits defined movement so that each substrate or wafer is in the center of each pair of divider teeth members.

The wafer carrier 216, including the substrates or wafers 370a–370n, are first placed in the bottom member 212 so that the bottom edges 294 and 296 rest in channels 242 and 246 of the bottom member 212. The top member 214 is then positioned over the carrier containing the substrates or wafers 370a–370n. The continuous vertical lip member 254 of the top member 214 aligns over the continuous lip member 236 as also illustrated in FIG. 20. Then, the flexible wafer support springs 350a–350n and 352a–352n position tangentially in flexing engagement against the circumference of the substrates or wafers 370a–370n, and the ramped catches 270a–270b and 272a–272b partially engage against the latch members 274 and 276. The top member 214 is positioned incorporating slightly more downward pressure against the substrates or wafers 370a–370n by the plurality of wafer support springs 350a–350n and 352a–352n, which move upwardly as illustrated until the catch surfaces 274a–274b and 276a–276b fully engage the catches 270 and 272 as the top member 214 centers over the substrates or wafers 370a–370n. The upper portion of the substrates or wafers 370a–370n locate in the "V" groove 362 between the ramped angulated walls 358 and 360 to assist in uniform lateral spacing of the upper portions of the substrate wafers with respect to each other. The "V" groove 362 between the angled ends 364 and 366 assist in capture of the upper substrate or wafer circumferential surfaces.

The top member 214 engages the wafer carrier 216 when the catch members 270 and 272 frictionally engage latch members 274 and 276, holding the wafer carrier 216 securely between the top and bottom members 214 and 212, respectively. More specifically, the planar members 253 and 255 contact and exert uniform downward pressure upon the planar top edges 298 and 300 of the wafer carrier 216. This exerted downward pressure is transmitted through the structure of the wafer carrier 216 to the wafer carrier bottom edges 294 and 296 which are seated in channels 242 and 244 of the bottom member 212, and is also transmitted to the channels 242 and 244 and the bottom member 212 in general.

The flexible wafer support springs 350a–350n and 352a–352n gently contact the circumference of each of the substrates or wafers 370a–370n respectively in a tangential fashion to ensure seating of the substrates or wafers 370a–370n within the wafer carrier 216 and within the engaged top and bottom members 214 and 212 to minimize movement of the substrates or wafers 370a–370n.

Both the wafer carrier 216 and the substrates or wafers 370a–370n are held in position by the top member 214 and the elements thereof. The spring action secures the substrates or wafers within the wafer carrier 216 and also provides an upward pressure towards the top member 214 with respect to the bottom member 212 so that when the catches and latches are disengaged from each other, the top member 214 is sprung upwardly by the action of the wafer support springs 350a–350n and 352a–352n against the substrates or wafers.

Figure 37:
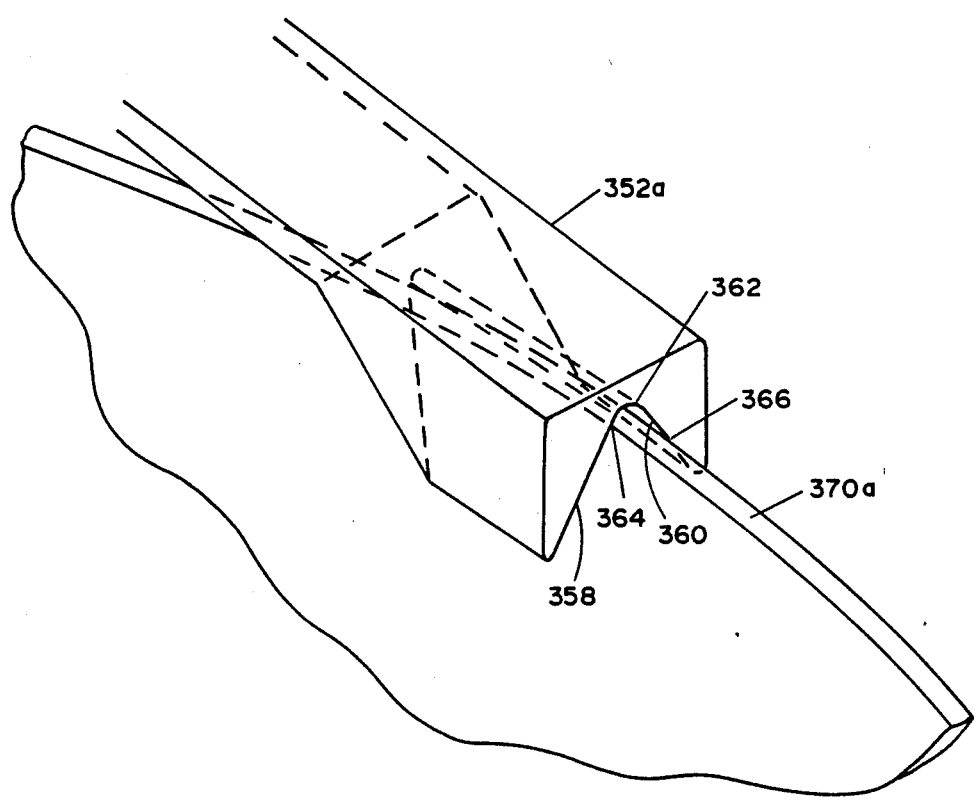
FIG. 37 illustrates an isometric view of the articulated cantilevered horizontal arm with a centering V groove engaging a wafer, disk or substrate.

FIG. 37 illustrates an isometric view of a articulated cantilevered horizontal arm 352a, also referred to as a like flexible wafer support spring arms 350a–350n and 352a–352n in spring support arm rows 350 and 352. with a centering V groove 362 engaging a wafer, disk or substrate 370a at two contact points 364 and 366. The wafer, disk or substrate 370a is supported in the V groove 362 at each side of the V groove and is centered by the action of the V groove 362 against the edges of the wafer, disk or substrate 370a.

Figure 38:
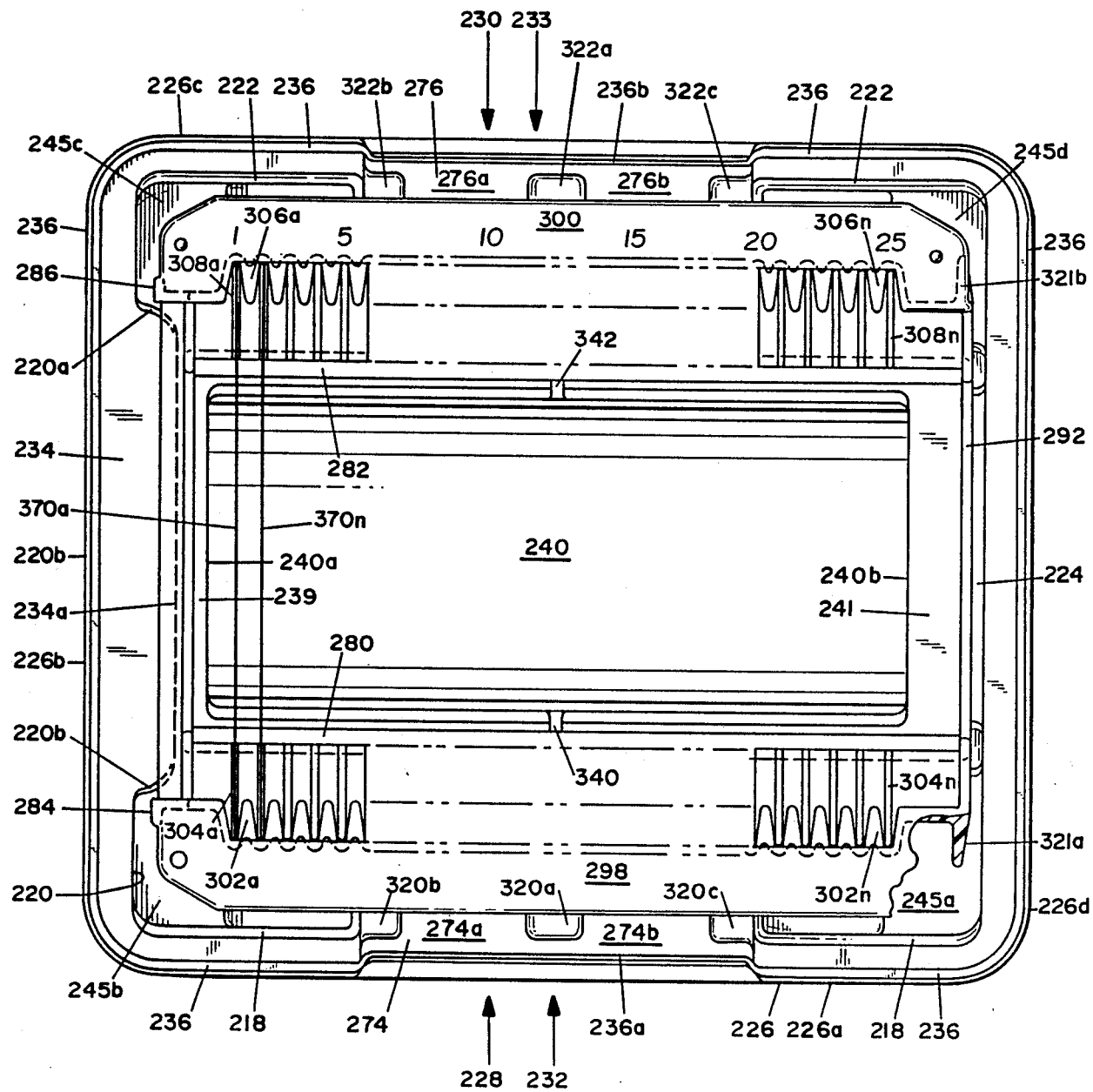
FIG. 38 illustrates a top view of a wafer carrier in the bottom member.

FIG. 38 shows that the wafer carrier 216 can be properly oriented and aligned in only one position with respect to the bottom member 212. The locating recess index member 234 allows only one proper orientation. The "H" shaped member 288 of the wafer carrier 216 engages over the locating recess index member 234. The vertical support bars 284 and 286 position around and about the locating recess index member 234. At the same time, planar member 292 of the wafer carrier 216 is closely juxtaposed with respect to the side 224. If the wafer carrier 216 is rotated 180° in either direction about its vertical axis, the planar member 292 of the wafer carrier 216 would have to fit in the area occupied by the locating recess index member 234 in order for the wafer carrier 216 to fit in the bottom member 212. Of course, the area of the "H" shaped member 288 below the segmented rod half 290 and between the vertical support bars 284 and 286 is accommodated by the locating recess index member 234.

It is noted that the top member 214 can be placed with either of its ends adjacent to either end of the bottom member 212.

The upper lips engage about the lower lips and the latches with the catches, and the interengaging relationship between the carrier, the bottom member 212 and the top member 214 about the substrates or wafers 370a–370n occurs during engagement. This interengaging relationship particularly reflects that the package is a synergistic combination which reduces and eliminates contamination of the wafers, as well as providing for storage and transportation of the substrates or wafers and providing a flush perimeter for taping of the top and bottom member 214 and 212, respectively, providing for secure shipping and storage. It is noted that the top member 214 aligns loosely with the bottom member 212 before the wafer support springs 350a–350n and 352a–352n align the substrates or wafers 370a–370n in the wafer carrier 216 on the center line of the divider ribs 302a-302n and teeth 306a-306n.

It is also particularly important to note that the latches are flush, providing that the container is suitable not only of being taped, but shrink-wrapped or bagged with some suitable type of polyester, polyethylene or mylar film, further providing a noncontaminate, closed container with structural integrity. This also reduces the cost of the container and maintains structural integrity of the wafers supported therein. The wafer carrier with respect to the top member and bottom member engages with the respective components so that the substrates or wafers are in frictional engagement with the entire substrate package.

Figure 39:
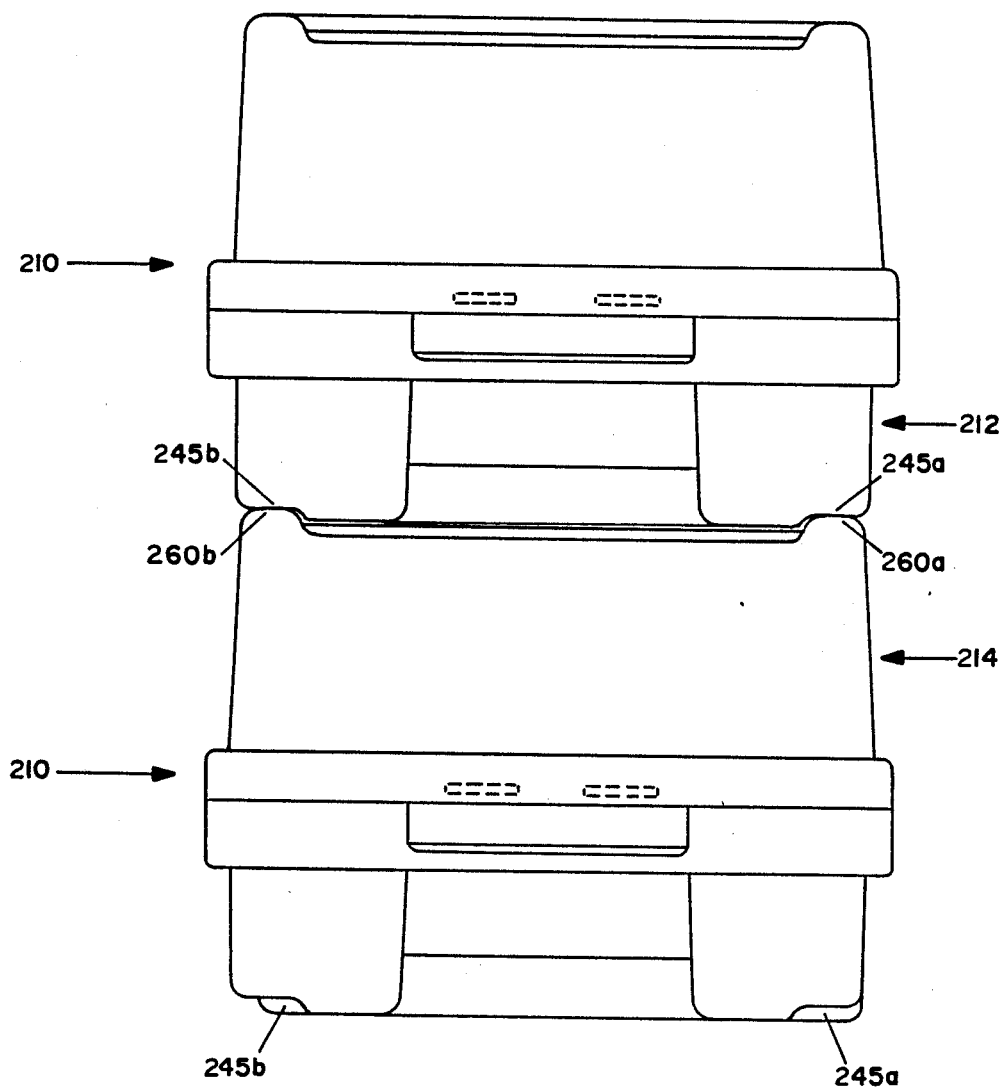
FIG. 39 illustrates stacked substrate packages.

FIG. 39 illustrates a side view of like substrate packages 210 stacked one upon another where all numerals correspond to those elements previously described. Like packages can be stacked by engagement of the stacking corner recess members 245a-245d of the bottom member 212 with the stacking feet 260a-260d of the top member 214 of another upper substrate package 210.

Various modifications can be made to the present invention without departing from the apparent scope hereof.

We claim:

1. A sealable contamination proof container package bottom and top for storing and transporting a plurality of wafers, disks or substrates in a wafer carrier comprising:
   a. a package bottom including four sides, a continuous vertical surface for tape sealing surrounding the four sides, a lip positional on said vertical surface, opposing hook latches on opposing sides, opposing hand grip recesses on the opposing sides and a raised bottom surface for package stacking; and,
   b. a package top including four sides, a continuous vertical surface for tape sealing, and surrounding the four sides, a lip positioned on said vertical surface, opposing hook catches on the opposing side, a top surface including raised stacking surfaces, and two rows of opposing articulated cantilevered horizontal arms with centering V grooves for engaging the wafer and projecting substantially horizontally directly inwardly from said top surface of said package top, disk or substrate positioned on the underside of the top surface at each side of said top surface whereby the package top and bottom halves provide that the wafer carrier mates between the package top and the package bottom with the wafers, disks or substrates in the carrier.

2. Package of claim 1 wherein said package top and bottom mate with said upper lip engaged against said lower lip, and said catch of said top engages with said latch of said bottom.

3. Package of claim 1 wherein the package halves move in a direction coinciding to the plane of the wafers with respect to positioning of said catches and latches on said package side.

4. Package of claim 1 wherein said sides of said package top and bottom are plumb with each other providing for a flush perimeter for ease of taping.

5. Package of claim 1 wherein said package top and said package bottom are of a polypropylene material or similar material.

6. Package of claim 1 including means for locating the wafer carrier.

7. A sealable contamination proof container package bottom and top for storing and transporting a plurality of wafers, disks or substrates in a wafer carrier comprising:
   a. a package bottom including four sides, a continuous vertical surface for tape sealing surrounding the four sides, a lip positional on said vertical surface, opposing hook latches on opposing sides, opposing hand grip recesses on the opposing sides and a raised bottom surface for package stacking;
   b. a package top including four sides, a continuous vertical surface for tape sealing, and surrounding the four sides, a lip positioned on said vertical surface, opposing hook catches on the opposing side, an arced top surface with a raised stacking surface, and two rows of opposing articulated cantilevered horizontal arms with centering V grooves for engaging the wafer projecting substantially horizontally directly inwardly from said arced top surface of said package top whereby the package top and bottom halves provide that the wafer carrier mates between the package top and the package bottom with the wafers or substrates in the carrier; and,
   wafer carrier including opposing closed side walls, a rear wall and a crossbar connecting the sidewalls and means on said carrier for robotic handling.

8. A device for containing a plurality of wafers, disks or substrates comprising:
   a. a rectangular package bottom having hand grip indentations;
   b. a removable wafer carrier having a plurality of spaced vertical channels for frictionally engaging said plurality of wafers wherein said removable wafer carrier mounts engagingly with said rectangular package bottom; and,
   c. a rectangular package top which mounts sealingly on said rectangular package bottom having a plurality of opposing articulated cantilevered horizontal arms with centering V grooves for engaging the wafer and projecting substantially horizontally directly inwardly from said arced top surface of said package top for engagingly holding said plurality of wafers when said plurality of wafers are frictionally engaged within said removable wafer carrier and said removable wafer carrier is engagingly mounted within said rectangular package bottom and said rectangular package top is sealingly mounted on said rectangular package bottom.

9. A device for containing a plurality of wafers, disks or substrates according to claim 8 wherein said plurality of opposing articulated cantilevered horizontal arms of said rectangular package top are arranged as a plurality of splined opposing articulated cantilevered horizontal arm pairs wherein each of said plurality of splined pairs engagingly holds a different on of said plurality of wafers, disks or substrates.

10. A device according to claim 9 wherein each of said plurality of splined opposing articulated cantilevered horizontal arm pairs are two opposed splined articulated cantilevered horizontal arms wherein each of said two opposed splined articulated cantilevered horizontal arms is individually attached to said rectangular package top.

* * * * *